(12) United States Patent
Hopkins et al.

(10) Patent No.: US 11,605,645 B2
(45) Date of Patent: Mar. 14, 2023

(54) INTEGRATED ASSEMBLIES HAVING VERTICALLY-SPACED CHANNEL MATERIAL SEGMENTS, AND METHODS OF FORMING INTEGRATED ASSEMBLIES

(71) Applicant: Micron Technology, Inc., Boise, ID (US)

(72) Inventors: John D. Hopkins, Meridian, ID (US); Shyam Surthi, Boise, ID (US)

(73) Assignee: Micron Technology, Inc., Baise, ID (US)

( * ) Notice: Subject to any disclaimer, the term of this patent is extended or adjusted under 35 U.S.C. 154(b) by 129 days.

(21) Appl. No.: 17/315,951

(22) Filed: May 10, 2021

(65) Prior Publication Data

US 2021/0280602 A1    Sep. 9, 2021

Related U.S. Application Data

(62) Division of application No. 16/434,052, filed on Jun. 6, 2019, now Pat. No. 11,031,414.

(51) Int. Cl.
| | |
|---|---|
| *H01L 27/11582* | (2017.01) |
| *G11C 5/06* | (2006.01) |
| *H01L 27/11519* | (2017.01) |
| *H01L 27/1157* | (2017.01) |
| *H01L 27/11556* | (2017.01) |
| *H01L 27/11565* | (2017.01) |
| *H01L 27/11524* | (2017.01) |

(52) U.S. Cl.
CPC ........ *H01L 27/11582* (2013.01); *G11C 5/063* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC combination set(s) only.
See application file for complete search history.

(56) References Cited

U.S. PATENT DOCUMENTS

| | | | |
|---|---|---|---|
| 9,653,475 B1 | 5/2017 | Yoshimizu | |
| 10,038,008 B1 | 7/2018 | Hopkins | |
| 10,700,078 B1 | 6/2020 | Cui | |
| 2010/0163968 A1* | 7/2010 | Kim | H01L 27/11582 257/E21.423 |
| 2016/0351582 A1* | 12/2016 | Kim | H01L 27/11582 |
| 2017/0125436 A1 | 5/2017 | Sharangpani | |
| 2017/0162593 A1 | 6/2017 | Shimura | |

* cited by examiner

*Primary Examiner* — Nduka E Ojeh
(74) *Attorney, Agent, or Firm* — Wells St. John P.S.

(57) ABSTRACT

Some embodiments include a NAND memory array having a vertical stack of alternating insulative levels and wordline levels. The wordline levels have primary regions of a first vertical thickness, and have terminal projections of a second vertical thickness which is greater than the first vertical thickness. The terminal projections include control gate regions. Charge-blocking regions are adjacent the control gate regions, and are vertically spaced from one another. Charge-storage regions are adjacent the charge-blocking regions and are vertically spaced from one another. Gate-dielectric material is adjacent the charge-storage regions. Channel material is adjacent the gate dielectric material. Some embodiments included methods of forming integrated assemblies.

13 Claims, 34 Drawing Sheets

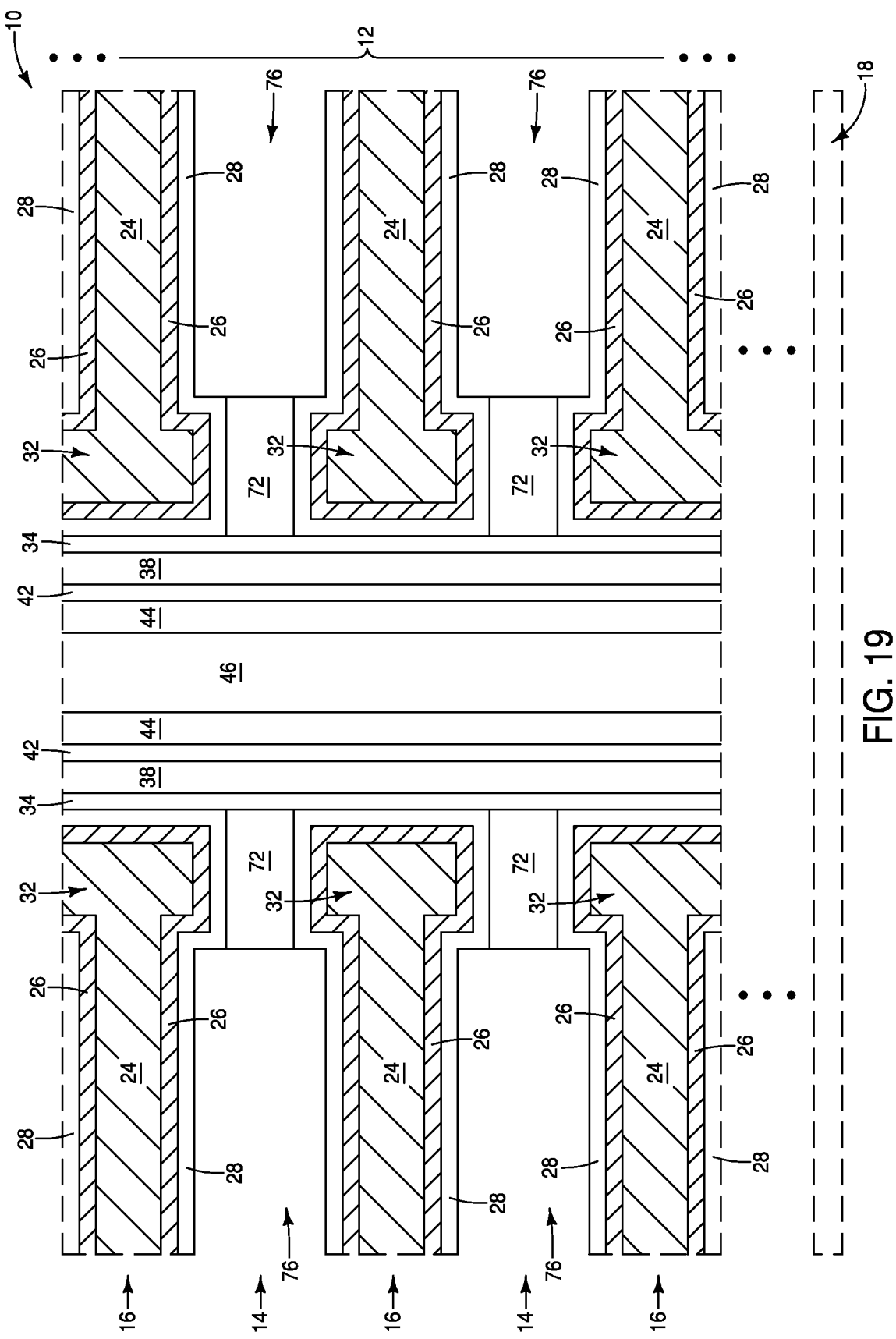

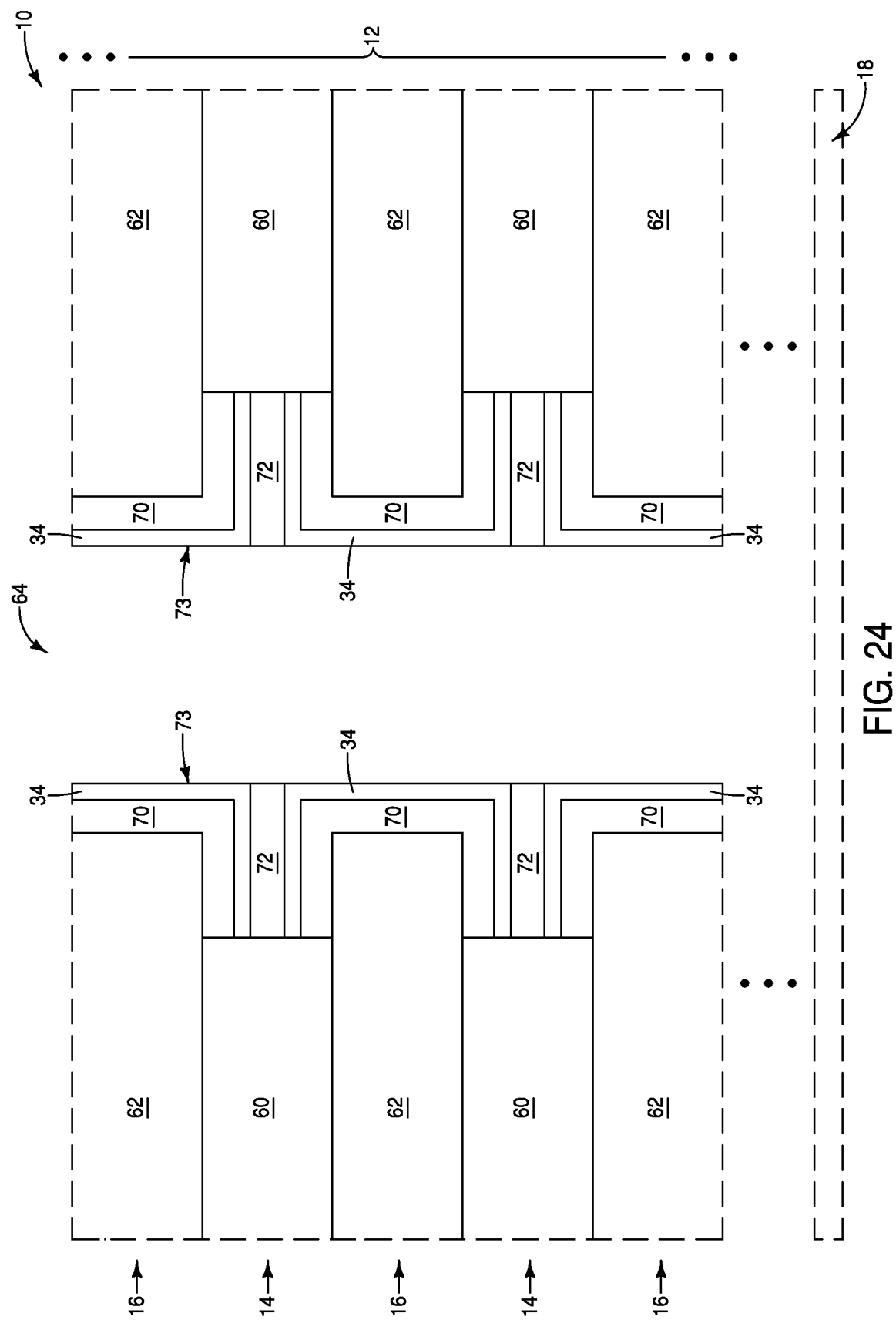

INTEGRATED ASSEMBLIES HAVING VERTICALLY-SPACED CHANNEL MATERIAL SEGMENTS, AND METHODS OF FORMING INTEGRATED ASSEMBLIES

RELATED PATENT DATA

This patent resulted from a divisional of U.S. patent application Ser. No. 16/434,052, filed Jun. 6, 2019, the disclosures of which are hereby incorporated herein by reference.

TECHNICAL FIELD

Integrated assemblies (e.g., integrated NAND memory) having vertically-spaced channel material segments, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIGS. 19-22 are diagrammatic cross-sectional side views of the region of the integrated assembly of FIG. 11 shown at example sequential process stages following the process stage of FIG. 18.

FIGS. 24 and 25 are diagrammatic cross-sectional side views of the region of the integrated assembly of FIG. 23 shown at example sequential process stages following the process stage of FIG. 23.

DETAILED DESCRIPTION OF THE ILLUSTRATED EMBODIMENTS

Operation of NAND memory cells comprises movement of charge between a channel material and a charge-storage material. For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with the electrons stored in the charge-storage material, and to thereby release charge from the charge-storage material. The charge-storage material may comprise charge-trapping material (for instance, silicon nitride, metal dots, etc.). A problem with conventional NAND can be that charge-trapping material extends across multiple memory cells of a memory array, and such can lead to charge migration from one memory cell to another. The charge migration may lead to data retention problems. Some embodiments include NAND architectures having breaks in the charge-trapping material in regions between memory cells; and such breaks may impede migration of charge between memory cells. Example embodiments are described with reference to FIGS. 5-30.

Figure 1:
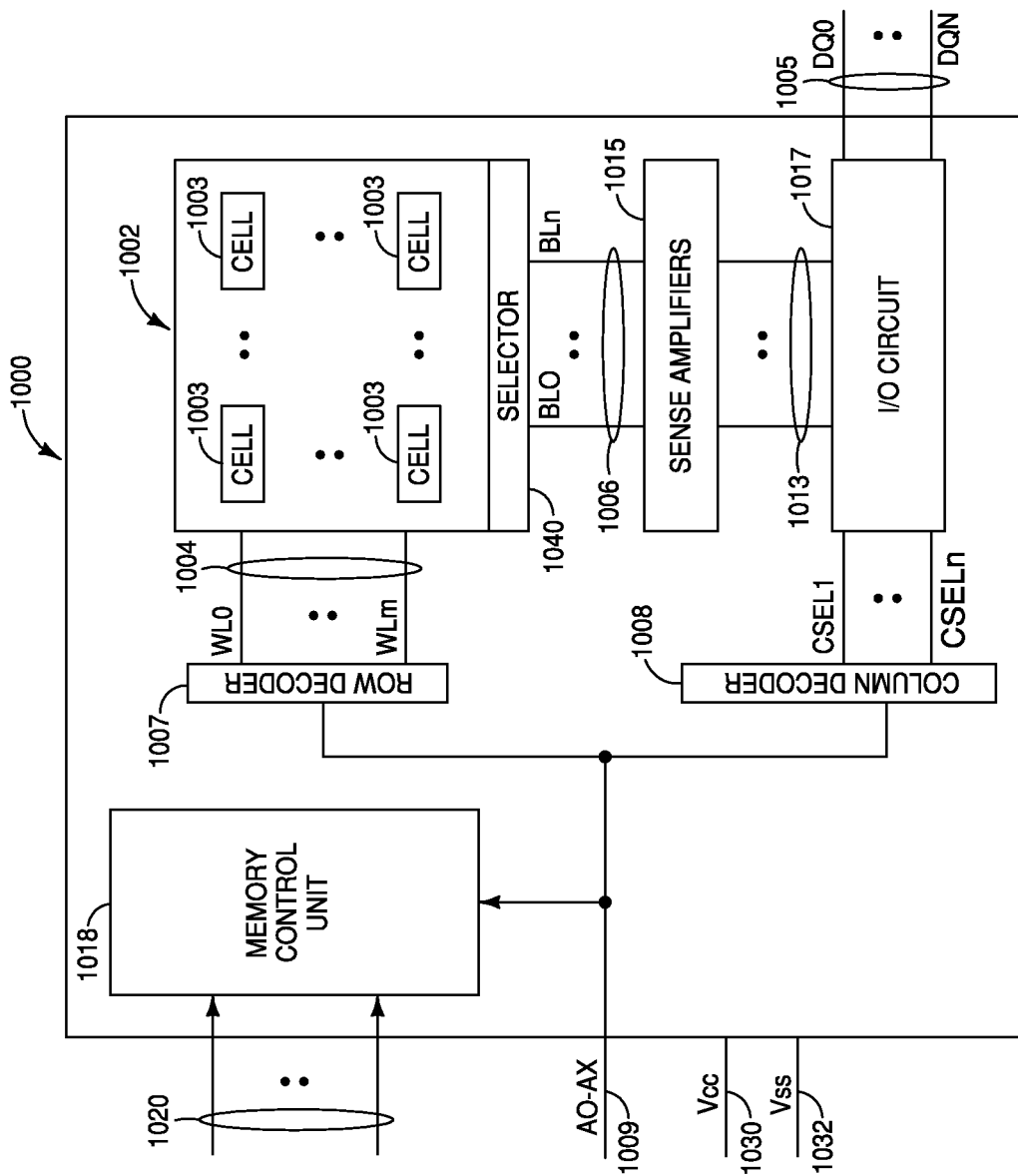
FIG. 1 shows a block diagram of a prior art memory device having a memory array with memory cells.
Figure 2:
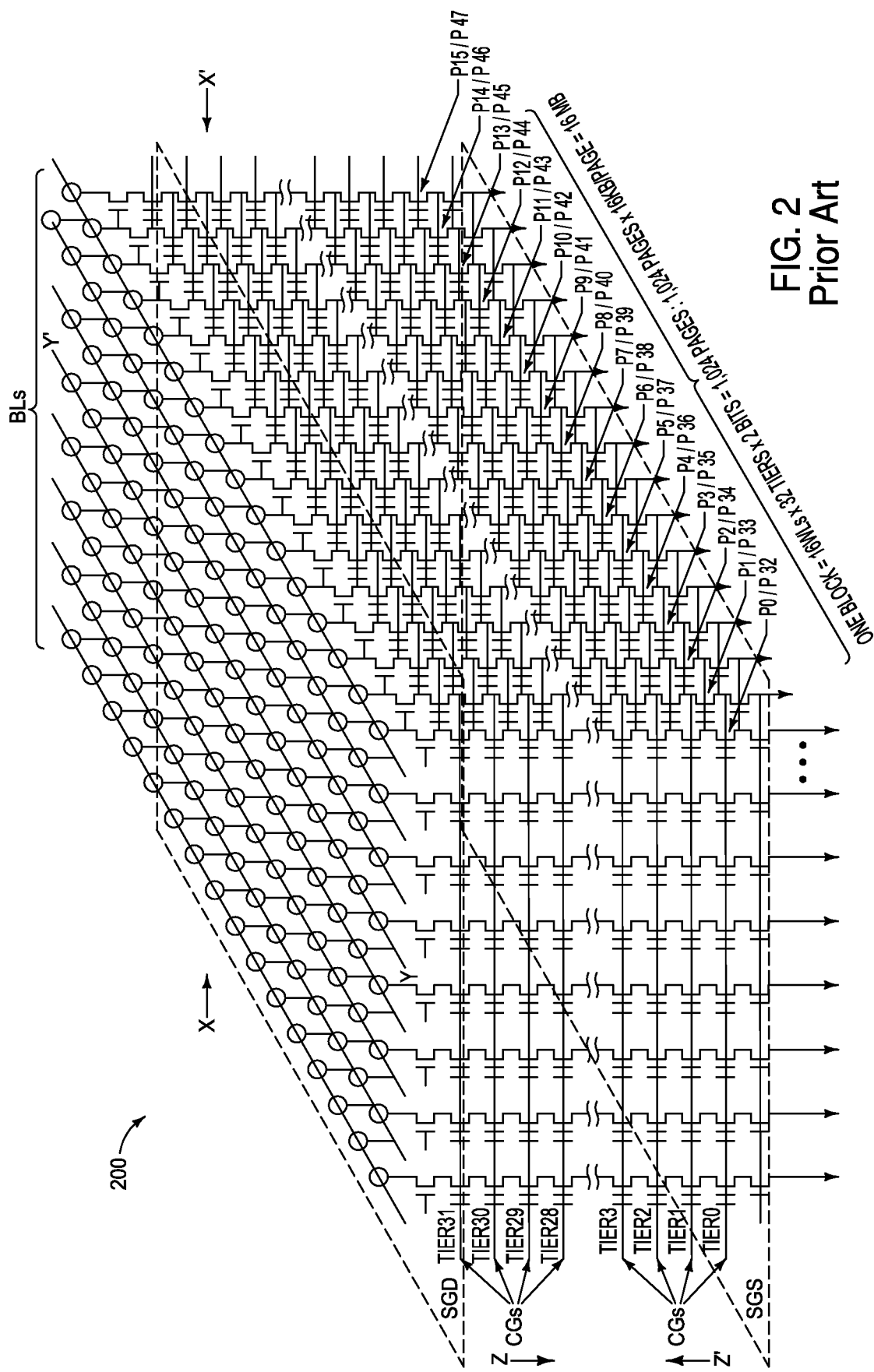
FIG. 2 shows a schematic diagram of the prior art memory array of FIG. 1 in the form of a 3D NAND memory device.
Figure 3:
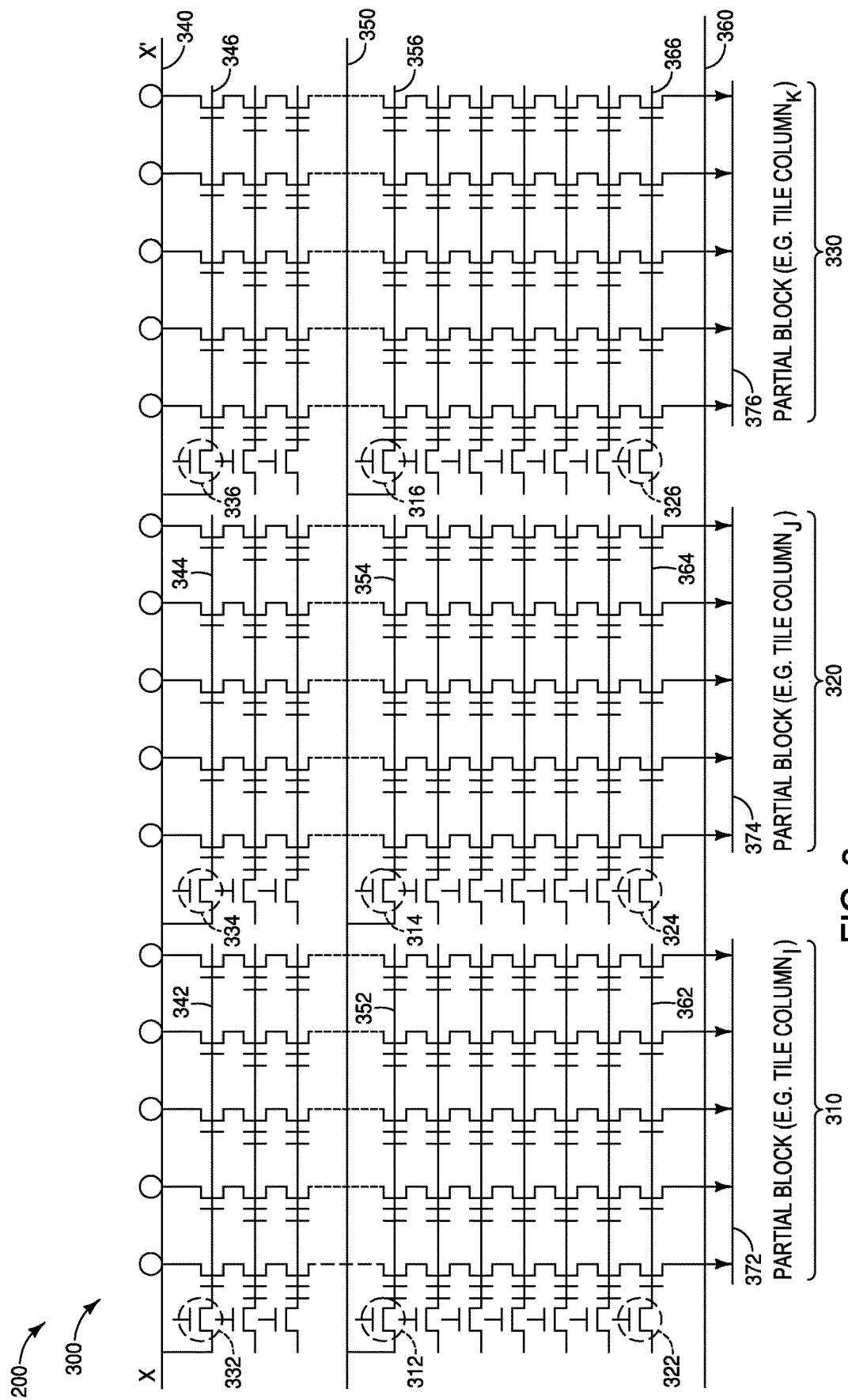
FIG. 3 shows a cross-sectional view of the prior art 3D NAND memory device of FIG. 2 in an X-X' direction.
Figure 4:
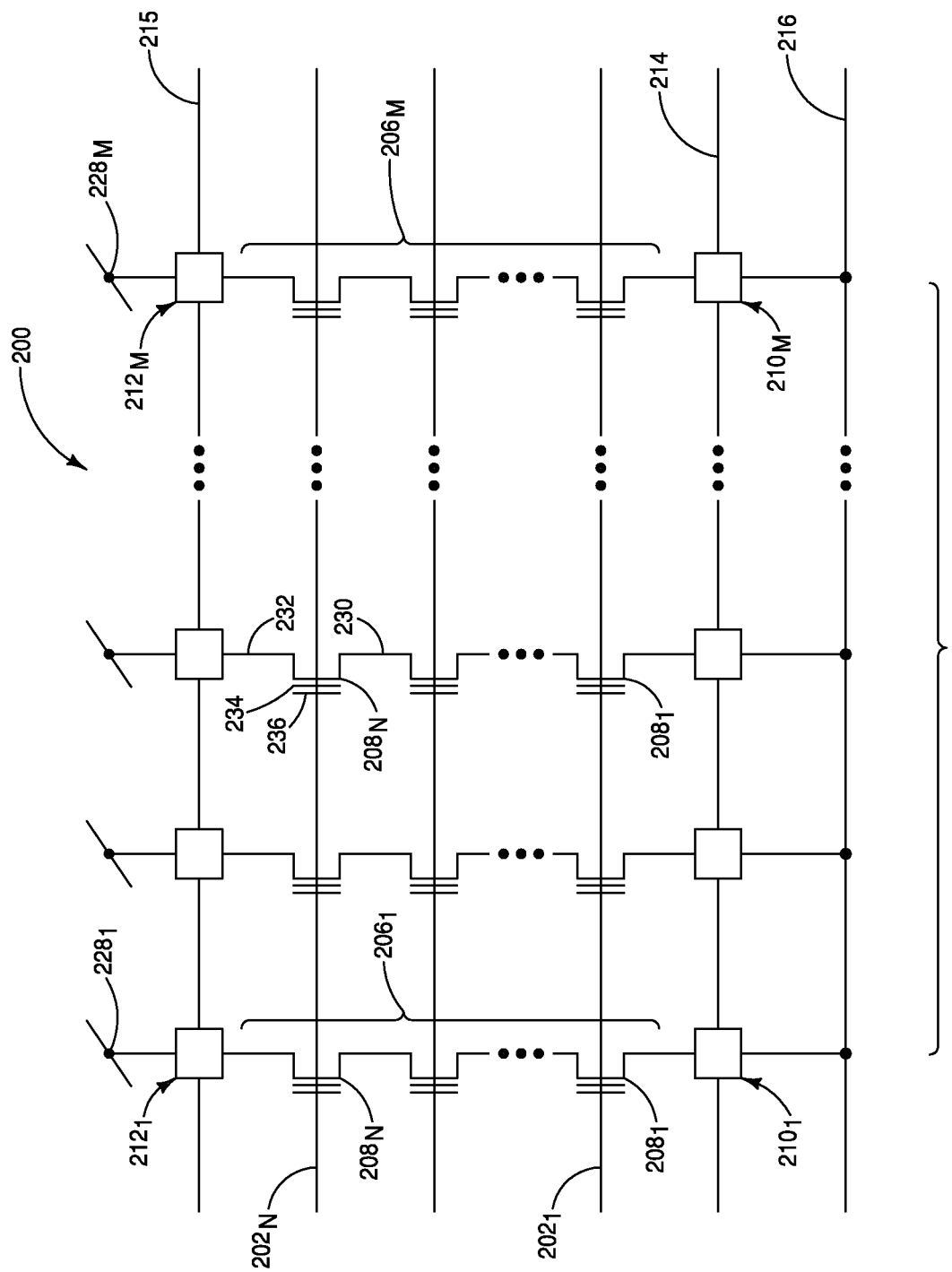
FIG. 4 is a schematic diagram of a prior art NAND memory array.
Figure 5:
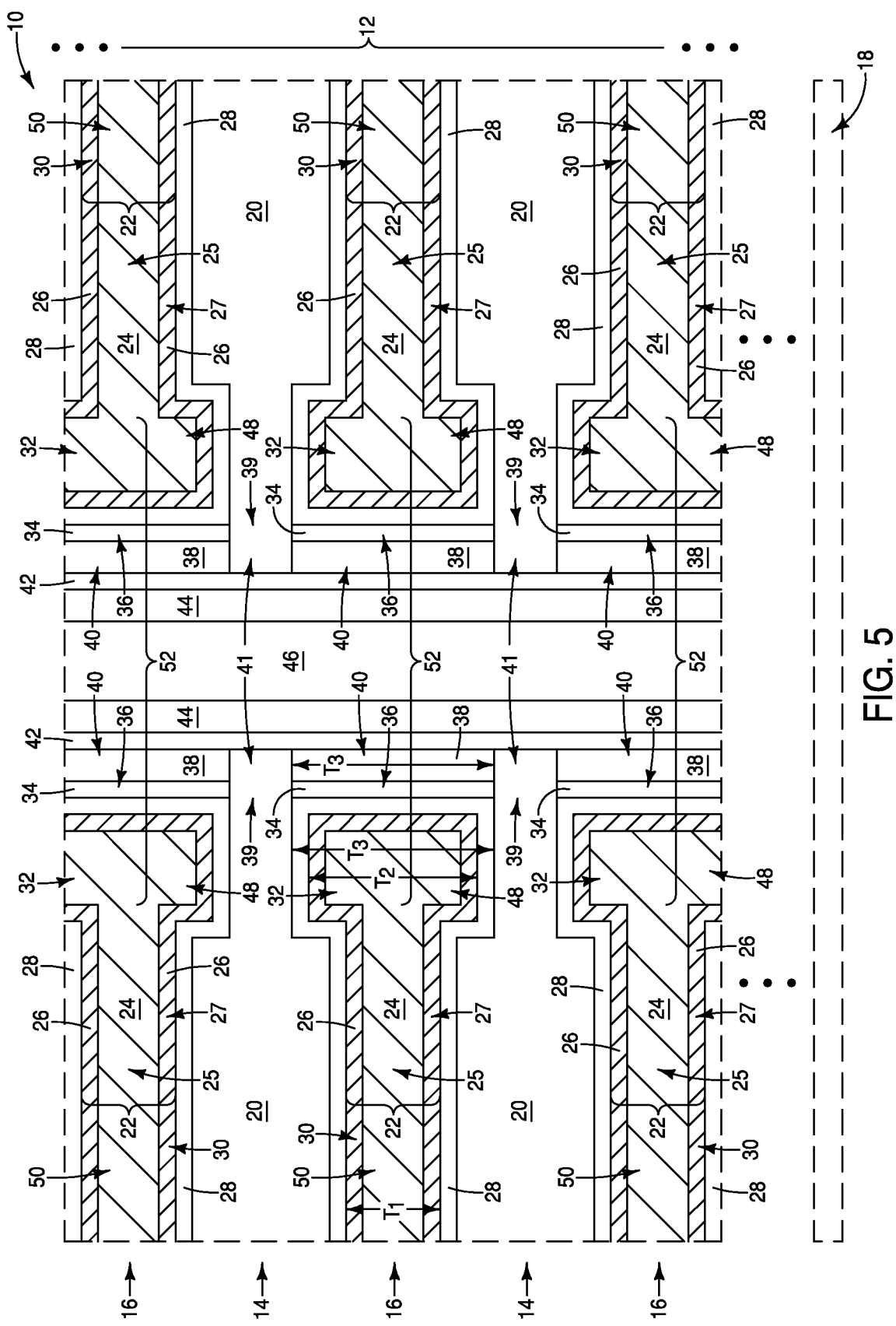
FIG. 5 is a diagrammatic cross-sectional side view of an integrated assembly showing a region of an example NAND memory array.

Referring to FIG. 5, a construction (i.e., assembly, architecture, etc.) 10 includes a vertical stack 12 of alternating first and second levels 14 and 16. The first levels 14 are insulative levels, and the second levels 16 are conductive levels.

The conductive levels 16 are memory cell levels (also referred to herein as wordline levels) of a NAND configuration. The NAND configuration includes strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc. The vertical stack 12 is indicated to extend vertically beyond the illustrated region to show that there may be more vertically-stacked levels than those specifically illustrated in the diagram of FIG. 5.

The stack 12 is shown to be supported over a base 18. The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductor wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 18 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 18 to indicate that other components and materials may be provided between the stack 12 and the base 18. Such other components and materials may comprise additional levels of the stack, a source line level, source-side select gates (SGSs), etc.

The insulative levels 14 comprise insulative material 20. The insulative material 20 may comprise any suitable composition(s); and in some embodiments may comprise, consist essentially of, or consist of silicon dioxide.

The conductive levels 16 comprise conductive regions 22. The conductive regions include an inner conductive material 24, and an outer conductive material 26. The inner conductive material 24 may be considered to be configured as a conductive core 25, and the outer conductive material 26 may be considered to be configured as an outer conductive layer 27 which surrounds the conductive core.

The conductive materials 24 and 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 24 and 26 are compositionally different from one another. In some embodiments the core material 24 may comprise one or more metals (e.g., may comprise tungsten), and the outer conductive material 26 may comprise one or more metal nitrides (e.g., may comprise titanium nitride).

Dielectric material 28 is along the outer conductive material 26. The dielectric material 28 may be dielectric barrier material, and may comprise any suitable composition(s). In some embodiments, the dielectric material 28 comprises high-k material, with the term "high-k" meaning a dielectric constant greater than that of silicon dioxide. In some embodiments, the dielectric material 28 may comprise, consist essentially of, or consist of one or more of AlO, HfO, HfSiO, ZrO and ZrSiO; where the chemical formulas indicate primary constituents rather than specific stoichiometries. In some embodiments, it may be advantageous to utilize high-k materials other than aluminum oxide (AlO) for the dielectric material 28 due to processing limitations described below. In such embodiments, it may be advantageous for the dielectric material 28 to comprise one or more of hafnium oxide (HfO), hafnium silicate (HfSiO), zirconium oxide (ZrO) and zirconium silicate (ZrSiO).

The conductive levels (wordline levels) 16 have primary regions 30 having a first vertical thickness $T_1$, and have terminal projections 32 having a second vertical thickness $T_2$ which is greater than the first vertical thickness. In some embodiments, the second vertical thickness $T_2$ is greater than the first vertical thickness $T_1$ by an amount within a range of from about 10% to about 70%. In the illustrated embodiment, the primary regions 30 are approximately vertically centered relative to the terminal projections 32.

Charge-blocking material 34 is along the terminal projections 32. The charge-blocking material 34 is arranged in vertically-stacked segments 36. The segments 36 are vertically spaced from one another by gaps 39. The charge-blocking material 34 may comprise any suitable composition(s); and in some embodiments may comprise, consist essentially of, or consist of one or both of silicon oxynitride (SiON) and silicon dioxide ($SiO_2$).

The segments 36 of the charge-blocking material 34 are adjacent the dielectric barrier material 28, and are spaced from the conductive material 26 of the terminal projections 32 by the dielectric barrier material 28.

Charge-storage material 38 is adjacent the charge-blocking material, and is arranged in vertically-stacked segments 40. The segments 36 and 40 may be referred to as first and second segments, respectively, to distinguish them from one another.

The second segments 40 (i.e., the segments of the charge-storage material 38) are vertically spaced from one another by gaps 41. In some embodiments, the gaps 39 and 41 may be referred to as first and second gaps, respectively, to distinguish them from one another. In some embodiments, the gaps 41 may be considered to be extensions of the gaps 39.

The charge-storage material 38 may comprise any suitable composition(s). In some embodiments the charge-storage material 38 may comprise charge-trapping materials; such as, for example, silicon nitride, silicon oxynitride, conductive nanodots, etc. For instance, in some embodiments the charge-storage material 38 may comprise, consist essentially of, or consist of silicon nitride. In alternative embodiments, the charge-storage material 38 may be configured to include floating gate material (such as, for example, polycrystalline silicon).

Gate-dielectric material (i.e., tunneling material) 42 is adjacent the charge-storage material 38. The gate-dielectric material 42 may comprise any suitable composition(s). In some embodiments, the gate-dielectric material 42 may comprise, for example, one or more of silicon dioxide, silicon nitride, silicon oxynitride, aluminum oxide, hafnium oxide, zirconium oxide, etc. The gate-dielectric material 42 may be bandgap-engineered to achieve desired electrical properties; and accordingly may comprise a combination of two or more different materials.

Channel material 44 is adjacent the gate-dielectric material 42, and extends vertically along the stack 12. The channel material 44 comprises semiconductor material; and may comprise any suitable composition or combination of compositions. For instance, the channel material 44 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 may comprise, consist essentially of, or consist of silicon.

Insulative material 46 is adjacent the channel material 44. The insulative material 46 may comprise any suitable composition(s); and in some embodiments may comprise, consist essentially of, or consist of silicon dioxide.

Figure 5A:
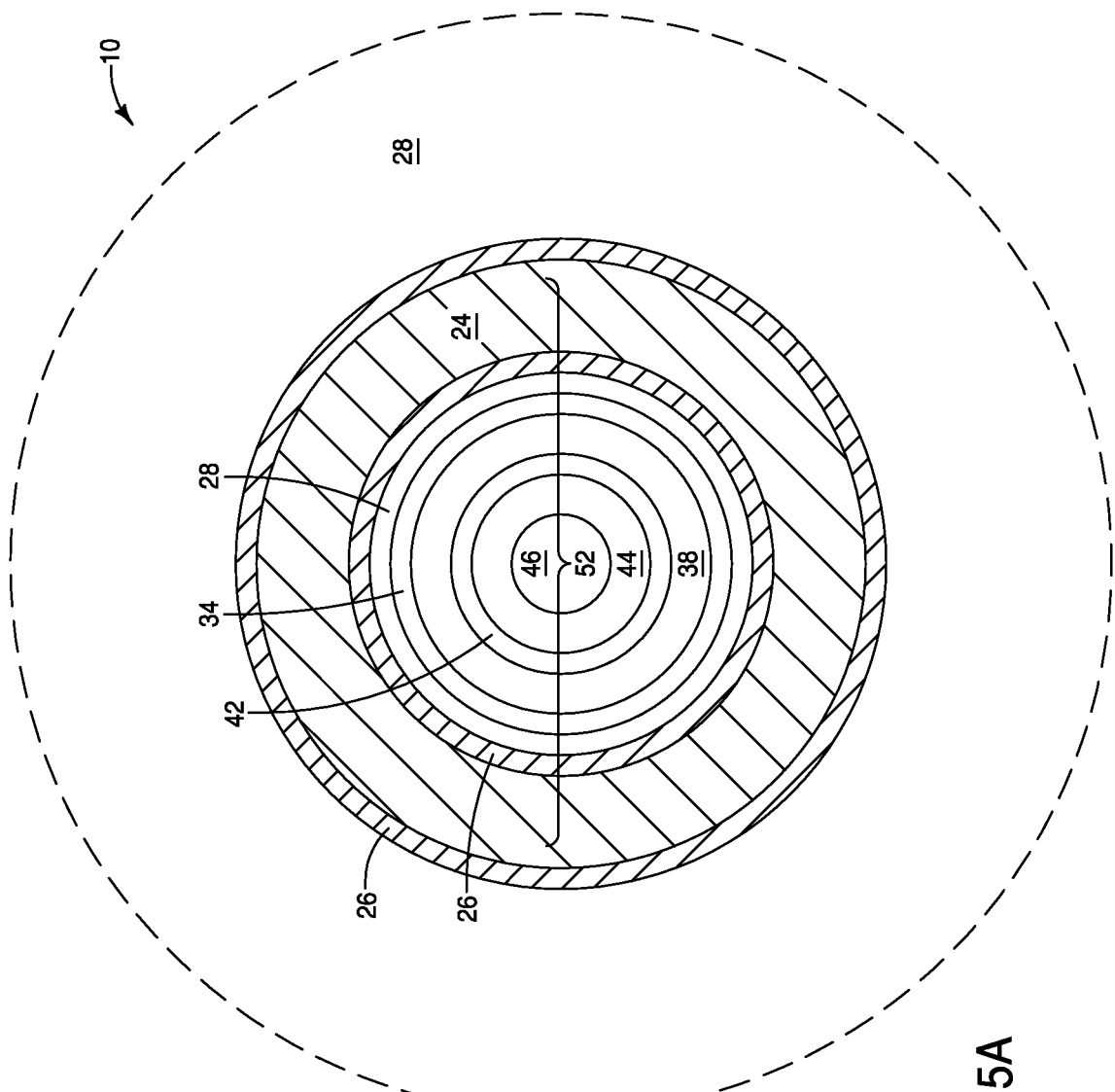
FIG. 5A is a diagrammatic top view of a portion of the integrated assembly of FIG. 5.

FIG. 5A shows a top view of a region of the assembly 10, and shows that the channel material 44 may be configured as an annular ring surrounding the insulative material 46. The illustrated configuration of the channel material may be considered to comprise a hollow channel configuration, in that the insulative material 46 is provided within a "hollow" in the annular ring-shaped channel configuration. In other embodiments (not shown), the channel material may be configured as a solid pillar configuration.

Referring again to FIG. 5, the conductive levels 16 may be considered to comprise control gate regions 48 proximate the channel material 44, and to comprise wordline regions 50 adjacent the control gate regions. In the illustrated embodiment, the control gate regions 48 include at least portions of the terminal projections 32.

The control gate regions 48, dielectric barrier material 28, charge-blocking material 34, charge-storage material 38, gate-dielectric material 42 and channel material 44 are incorporated into NAND memory cells 52. The illustrated NAND memory cells 52 form a portion of a vertically-extending string of memory cells. Such string may be representative of a large number of substantially identical NAND strings formed during fabrication of a NAND memory array (with the term "substantially identical" meaning identical to within reasonable tolerances of fabrication and measurement).

In the illustrated embodiment of FIG. 5, the segments 40 of the charge-storage material 38 have a vertical thickness $T_3$ which is larger than the vertical thickness $T_2$ of the conductive terminal projections 32; and which is about the same as a vertical thickness through the dielectric barrier material 28 and the conductive projection 32. In some embodiments, the vertical thickness of the segments 40 of the charge-storage material 38 may be less than shown in FIG. 5 due to some etching of the charge-storage material during formation of the segments 40. In other embodiments, the vertical thickness of the segments 40 may be larger than is shown in FIG. 5. The thickness $T_3$ of the charge-storage-material segments 40 may be considered to be tailored to approximately match a vertical thickness of the conductive projections 32 in some embodiments.

Notably, the channel material 44 is "flat" (i.e., is substantially vertically of continuous thickness, and is substantially vertically straight), as opposed to being undulating, in the configuration of FIG. 5. The flat channel material may positively impact string current as compared to non-flat configurations of some conventional designs. In some embodiments, the configuration of the channel material 44 may be referred to as a "flat configuration". Notably, the segments 40 of the charge-storage material 38 are also "flat"; and may be considered to each be in a "flat configuration". The flat segments 40 may have more even charge-distribution than would non-flat segments of the charge-storage material.

In operation, the charge-storage material 38 may be configured to store information in the memory cells 52. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 48, and/or based on the value of voltage applied to the channel material 44.

The tunneling material 42 forms tunneling regions of the memory cells 52. Such tunneling regions may be configured to allow desired migration (e.g., transportation) of charge (e.g., electrons) between the charge-storage material 38 and the channel material 44. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 34 is adjacent to the charge-storage material 38, and may provide a mechanism to block charge from flowing from the charge-storage material 38 to the associated gates 48.

The dielectric-barrier material 28 is provided between the charge-blocking material 34 and the associated gates 48, and may be utilized to inhibit back-tunneling of charge carriers from the gates 48 toward the charge-storage material 38. In some embodiments, the dielectric-barrier material 28 may be considered to form dielectric-barrier regions within the memory cells 52.

Figure 6:
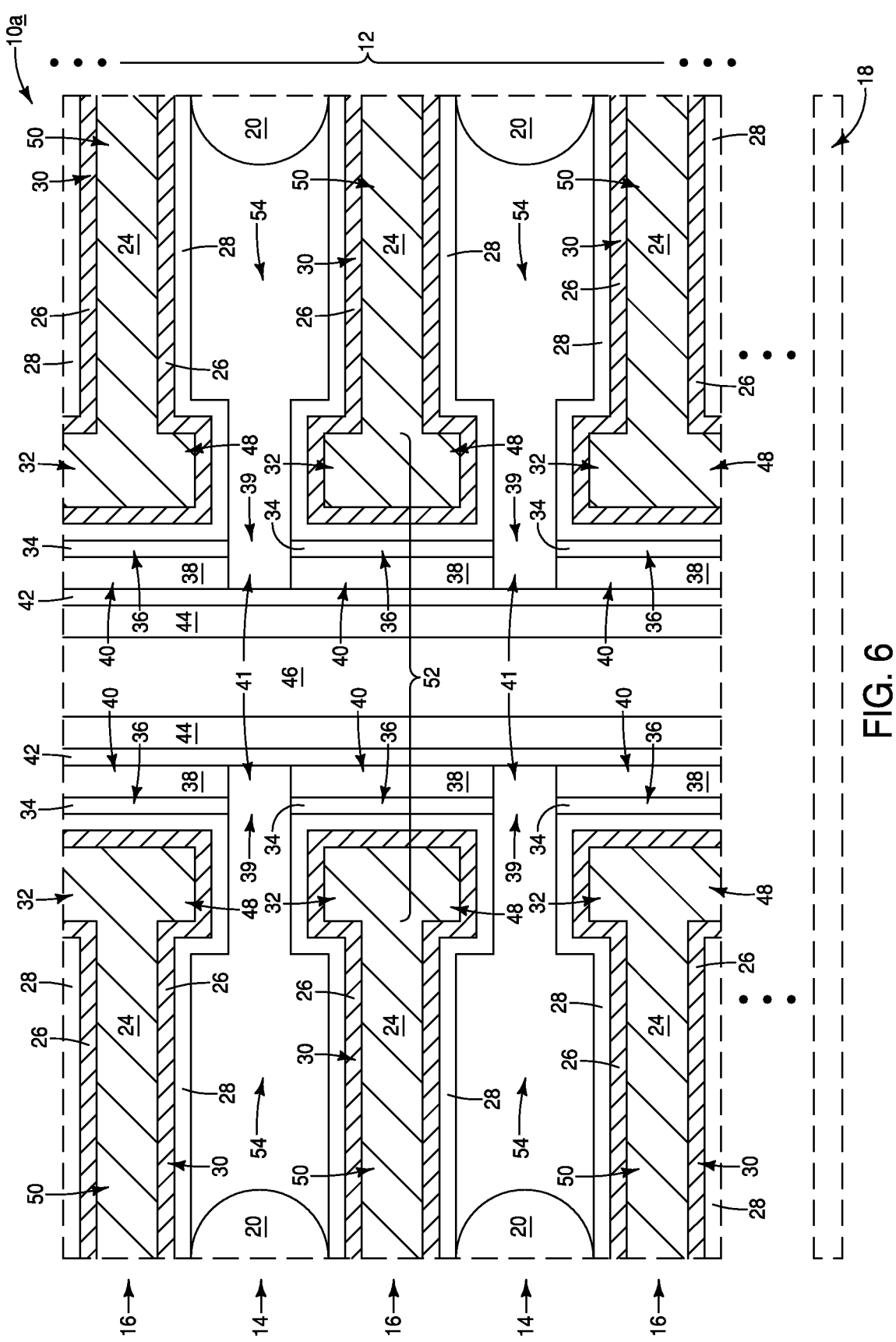
FIGS. 6-10 are diagrammatic cross-sectional side views of integrated assemblies showing regions of example NAND memory arrays.

The embodiment of FIG. 5 has insulative material 20 throughout the insulative levels 14. In other embodiments, there may be voids within the insulative levels. For instance, FIG. 6 shows an assembly 10a similar to the assembly 10 of FIG. 5, but comprising voids 54 within the insulative levels 14. In the illustrated embodiment, the voids 54 are capped with the insulative material 20. The voids 54 may be filled with air or any other suitable gas. An advantage of having the voids 54 within the insulative levels is that such may alleviate capacitive coupling between vertically-neighboring materials in the event that such capacitive coupling is found to be problematic. In the illustrated embodiment, the voids 54 extend within the gaps 41 between the vertically-stacked segments 40 of the charge-storage material 38.

Figure 7:
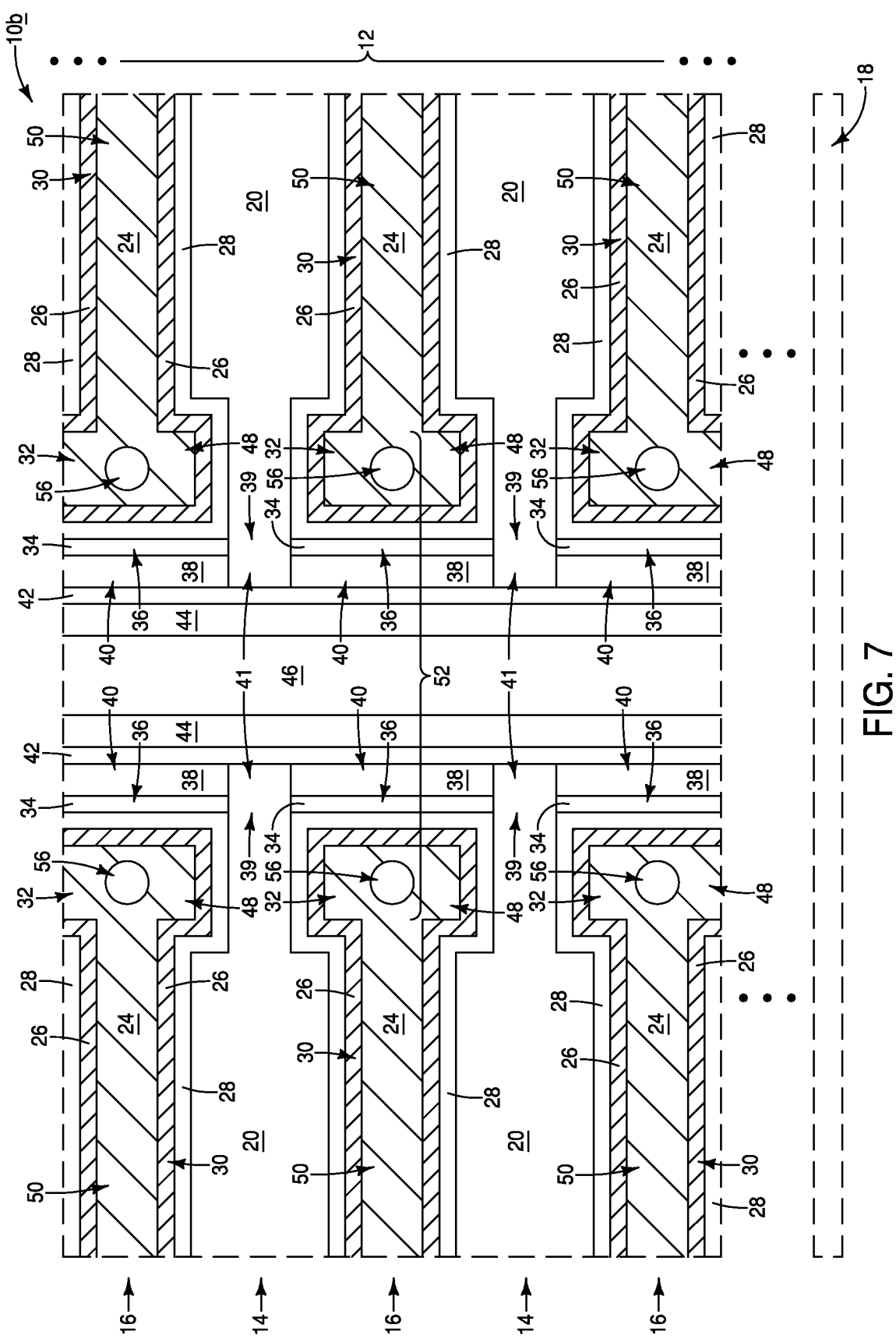

Voids may also be present within the terminal projections 32, as shown as voids 56 in an example assembly 10b of FIG. 7. The voids 56 may result from the processing utilized to form the conductive materials 24 and 26, as described in more detail below. Although the embodiment of FIG. 7 shows the voids 56 being in each of the terminal projections 32, in other embodiments the voids 56 may be within only some of the terminal projections 32 rather than within all of the terminal projections. However, it can be advantageous that the electrical properties of all of the terminal projections be substantially identical to one another; and accordingly it can be advantageous that all of the terminal projections be physically substantially identical to one another. Accordingly, if the voids 56 form, it can be advantageous that the voids 56 be within all of the projections 32, and that the voids within each of the terminal projections be of substantially the same size and shape as the voids within the other terminal projections.

Figure 8:
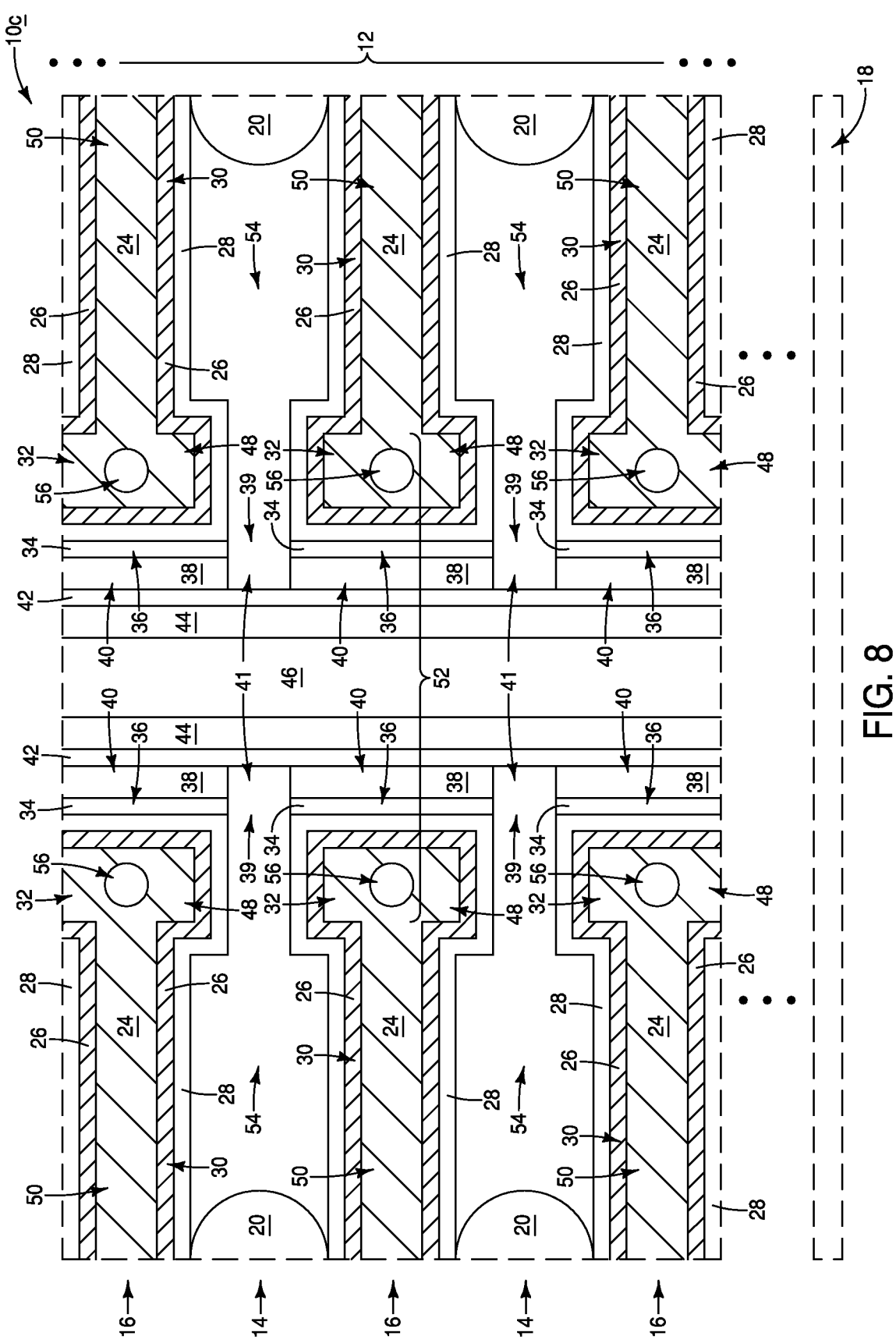

In some embodiments, the voids 54 and 56 may both be present, as shown relative to an assembly 10c of FIG. 8.

In the embodiment of FIG. 5, the segments 36 of the charge-blocking material 34 were along one edge of the terminal projections 32. In other embodiments, the segments 36 may wrap partially around the terminal projections 32, as shown relative to an assembly 10d of FIG. 9. It is noted that the charge-storage segments 40 of FIG. 9 have vertical thicknesses $T_4$ which are larger than the vertical thicknesses $T_2$ and $T_3$.

In the embodiments of FIGS. 5-9, the segments 36 of the charge-blocking material 34 comprise only a single homogeneous composition. In other embodiments, the segments may comprise laminates of two or more different compositions. For instance, FIG. 10 shows an assembly 10e in which the charge-blocking material 34 comprises a laminate of two different compositions 34a and 34b; with the compositions 34a and 34b joining to one another along a vertically-extending interface 57.

The compositions 34a and 34b may comprise any suitable substances. In some embodiments, one of the compositions may comprise, consist essentially of, or consist of silicon oxynitride; and the other may comprise, consist essentially of, or consist of silicon dioxide.

Figure 9:
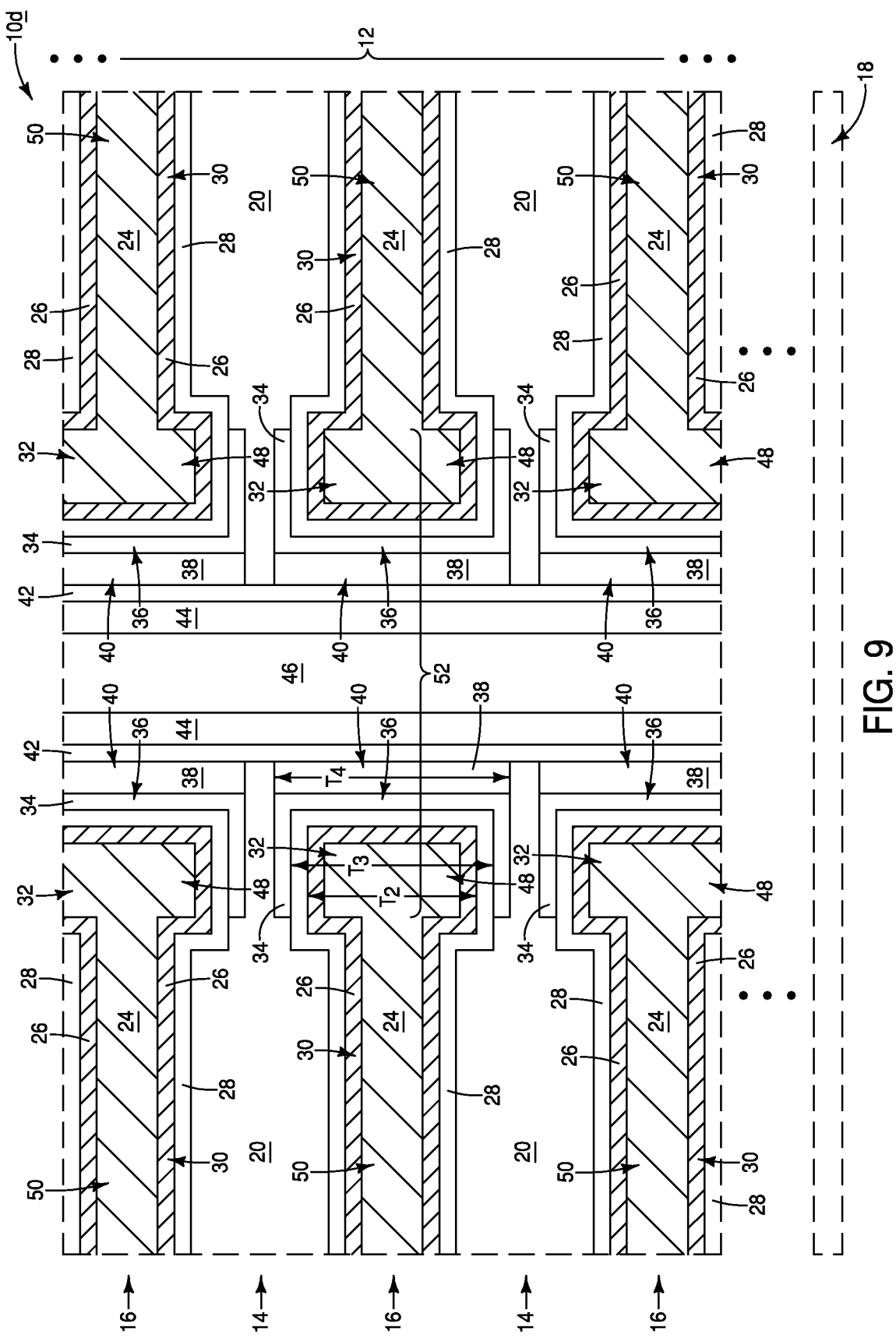
Figure 10:
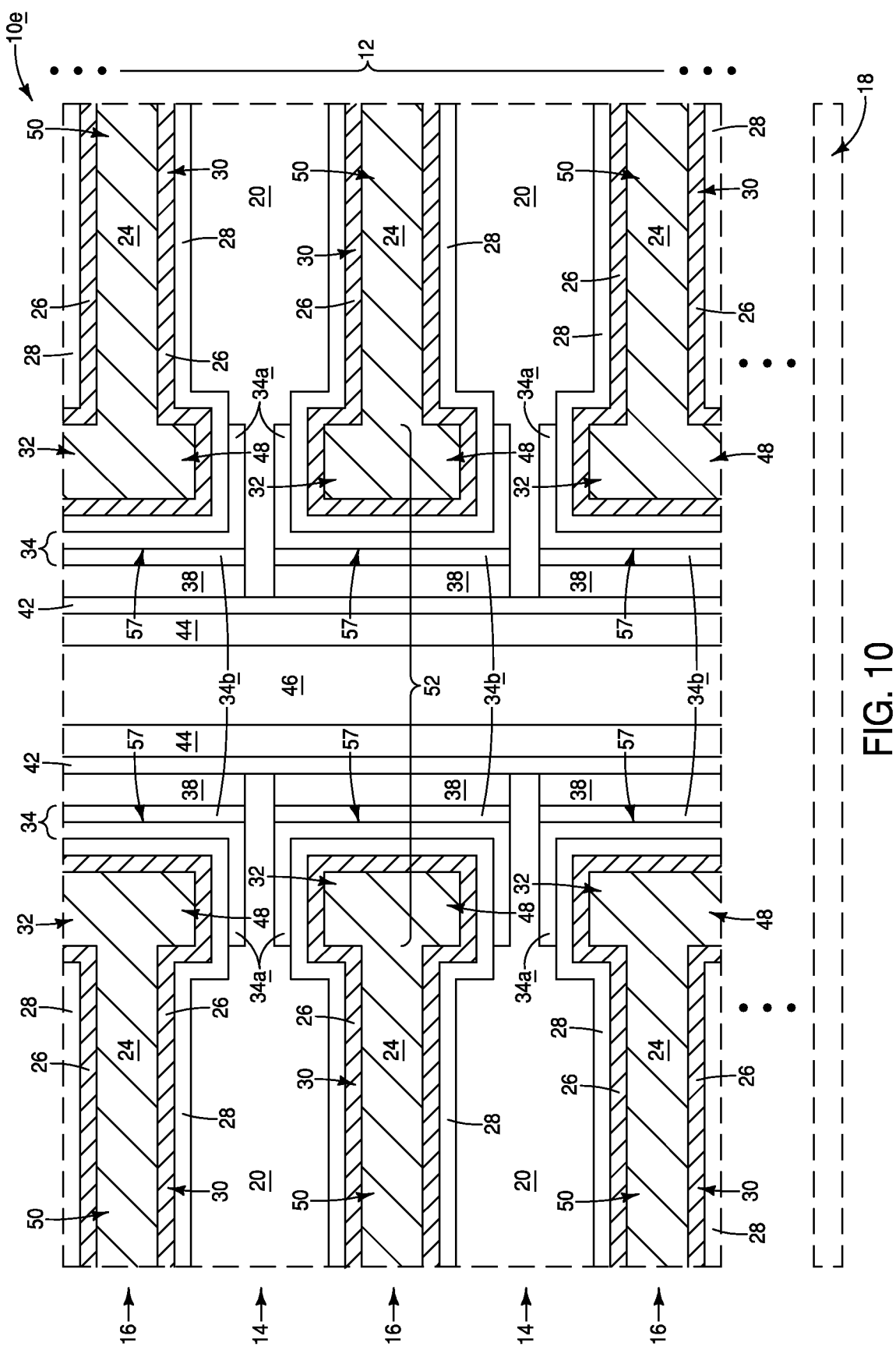

The embodiments of FIGS. 9 and 10 show the projections 32 lacking the voids 56 (FIG. 7), and show the insulative levels 14 lacking the voids 54 (FIG. 8). In other embodiments, assemblies analogous to those of FIGS. 9 and 10 may be formed to include the voids 54 and/or the voids 56.

The assemblies described above may be formed with any suitable methods. Example methods are described with reference to FIGS. 11-30.

Figure 11:
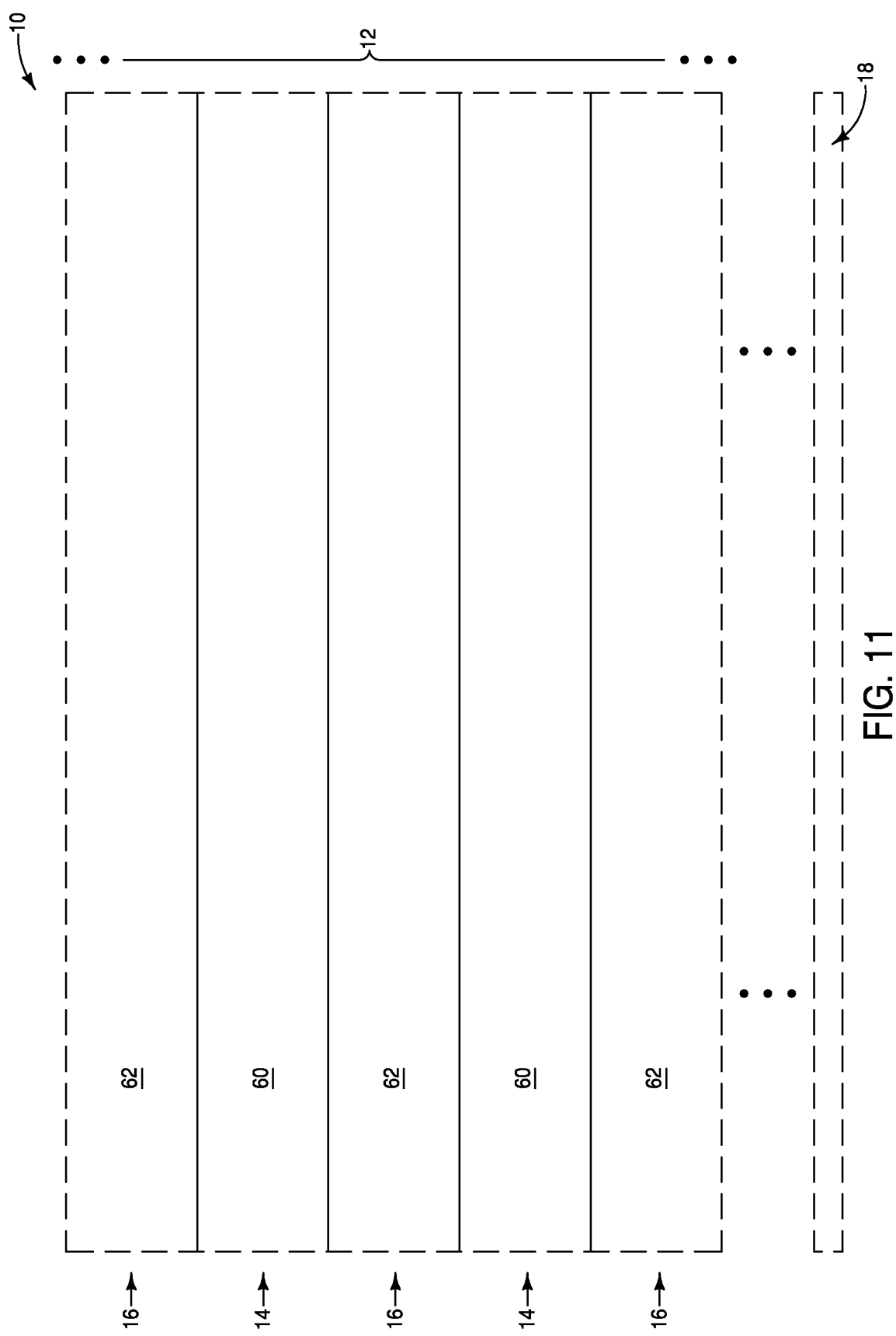
FIG. 11 is a diagrammatic cross-sectional side view of an integrated assembly at an example process stage of an example method for forming an example memory array.

Referring to FIG. 11, a construction 10 includes a vertical stack 12 of alternating first and second levels 14 and 16. The first levels 14 comprise a first material 60, and the second levels 16 comprise a second material 62. The first and second materials may comprise any suitable compositions, and are of different compositions relative to one another. In some embodiments, the first material 60 may comprise, consist essentially of, or consist of silicon dioxide; and the second material 62 may comprise, consist essentially of, or consist of silicon nitride. The second levels 16 will eventually become the wordline levels described above with reference to, for example, FIG. 5. The levels 14 and 16 may be of any suitable thicknesses at the process stage of FIG. 11; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have thicknesses within a range of from about 10 nm to about 50 nm.

Figure 12:
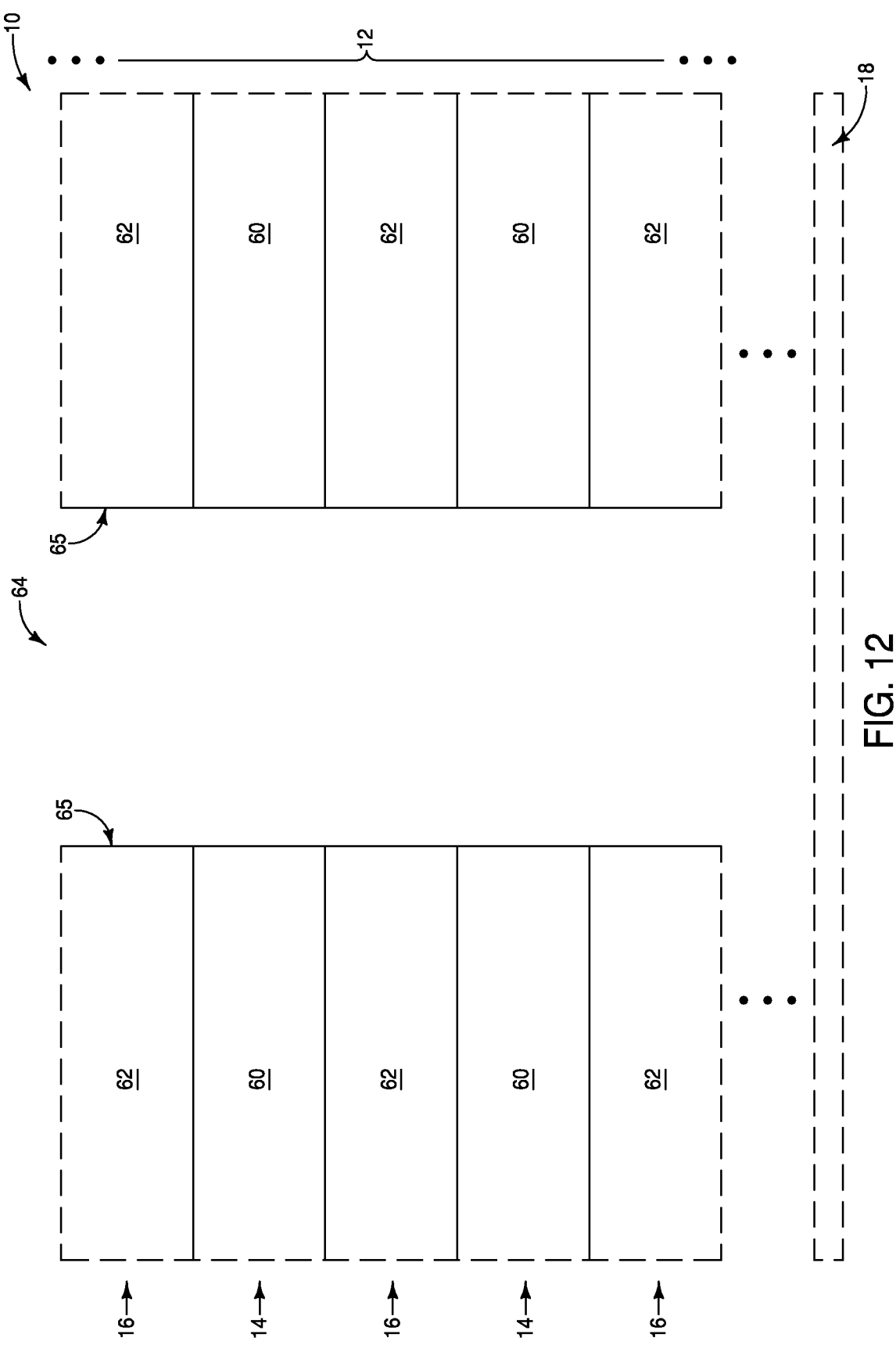
FIGS. 12-18 are diagrammatic cross-sectional side views of the region of the integrated assembly of FIG. 11 shown at example sequential process stages following the process stage of FIG. 11.

Referring to FIG. 12, an opening 64 is formed to extend through the stack 12. The opening has sidewalls 65 extending along the first and second materials 60 and 62.

Figure 13:
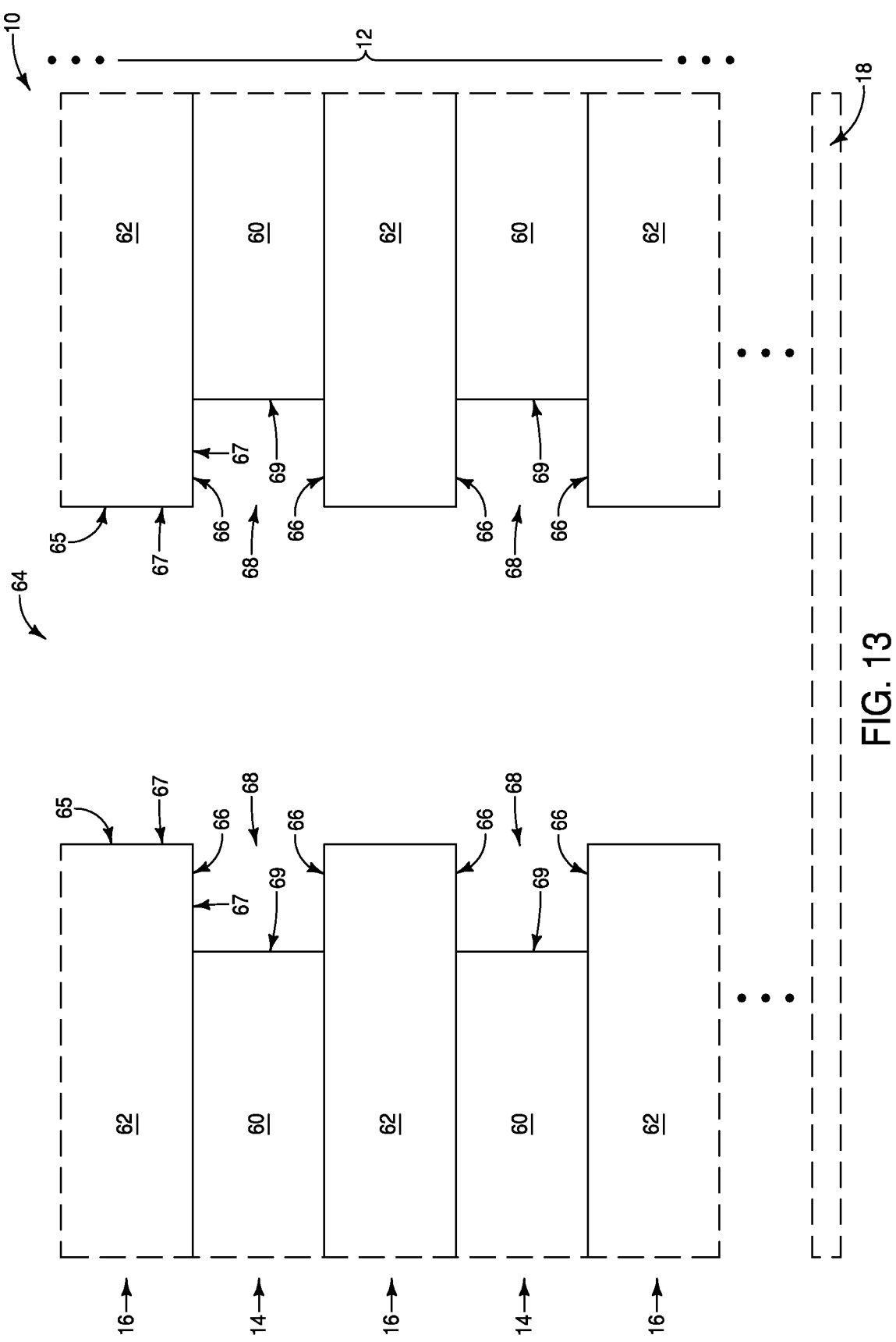

Referring to FIG. 13, the first levels 14 are recessed relative to the second levels 16 along the sidewalls 65 of the opening 64. After the recessing, the second levels 16 have projecting terminal ends 66 which extend inwardly beyond the recessed first levels 14. The terminal ends 66 have surfaces 67 of the second material 62. The recessed first levels 14 have surfaces 69 of the first material 60. Cavities (gaps) 68 are vertically between the terminal ends 66. The surfaces 69 may be considered to be along inner edges of the cavities 68.

Figure 14:
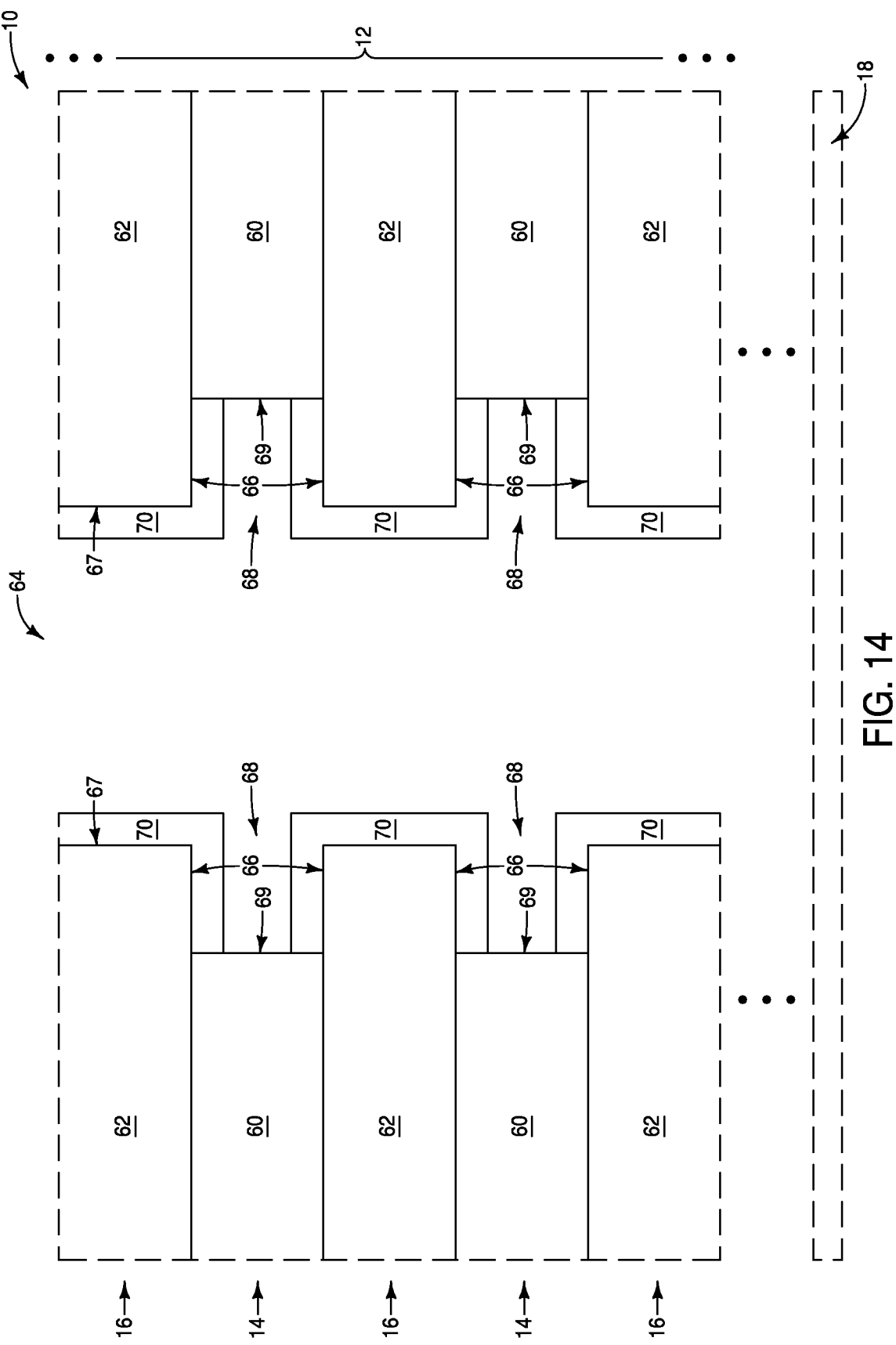

Referring to FIG. 14, a third material 70 is selectively formed to be along the second material 62 relative to the first material 60. Accordingly, the material 70 selectively forms along the surfaces 67 relative to the surfaces 69. The material 70 may comprise any suitable composition(s); and in some embodiments may comprise, consist essentially of, or consist of silicon nitride. Accordingly, the third material 70 may comprise a same composition as the second material 62.

The material 70 may be selectively formed along the second material 62 relative to the first material 60 utilizing any suitable processing. In some embodiments, a hindering material (also referred to herein as a poisoning material) may be selectively formed along the first material 60 relative to the second material 62 to preclude subsequent formation of the material 70 along surfaces of the first material 60, and then the material 70 may be formed by a suitable deposition process (e.g., atomic layer deposition, chemical vapor deposition, etc.). The hindering material may comprise any suitable composition(s); and in some embodiments may comprise one or more of N,N dimethylaminotrimethylsilane, bis(N,N-dimethylamino)dimethylsilane, ethylenediamine, 1-trimethylsilylpyrrolidine, 1-trimethylsilylpyrrole, 3,5-dimethyl-1-trimethylsilyl, and R1-(C—OH)—R2; where R1 and R2 are organic moieties.

The third material 70 wraps around the terminal ends 66 of the second levels 16 to widen the terminal ends. The widened terminal ends are vertically spaced from one another by remaining regions of the gaps 68.

The material 70 may be formed to any suitable thickness; and in some embodiments may be formed to a thickness of from about 1 nm to about 10 nm. The thickness of the material 70 may be utilized to tune the vertical thickness $T_2$ of the conductive projections 32 (FIG. 5) in some embodiments.

Figure 15:
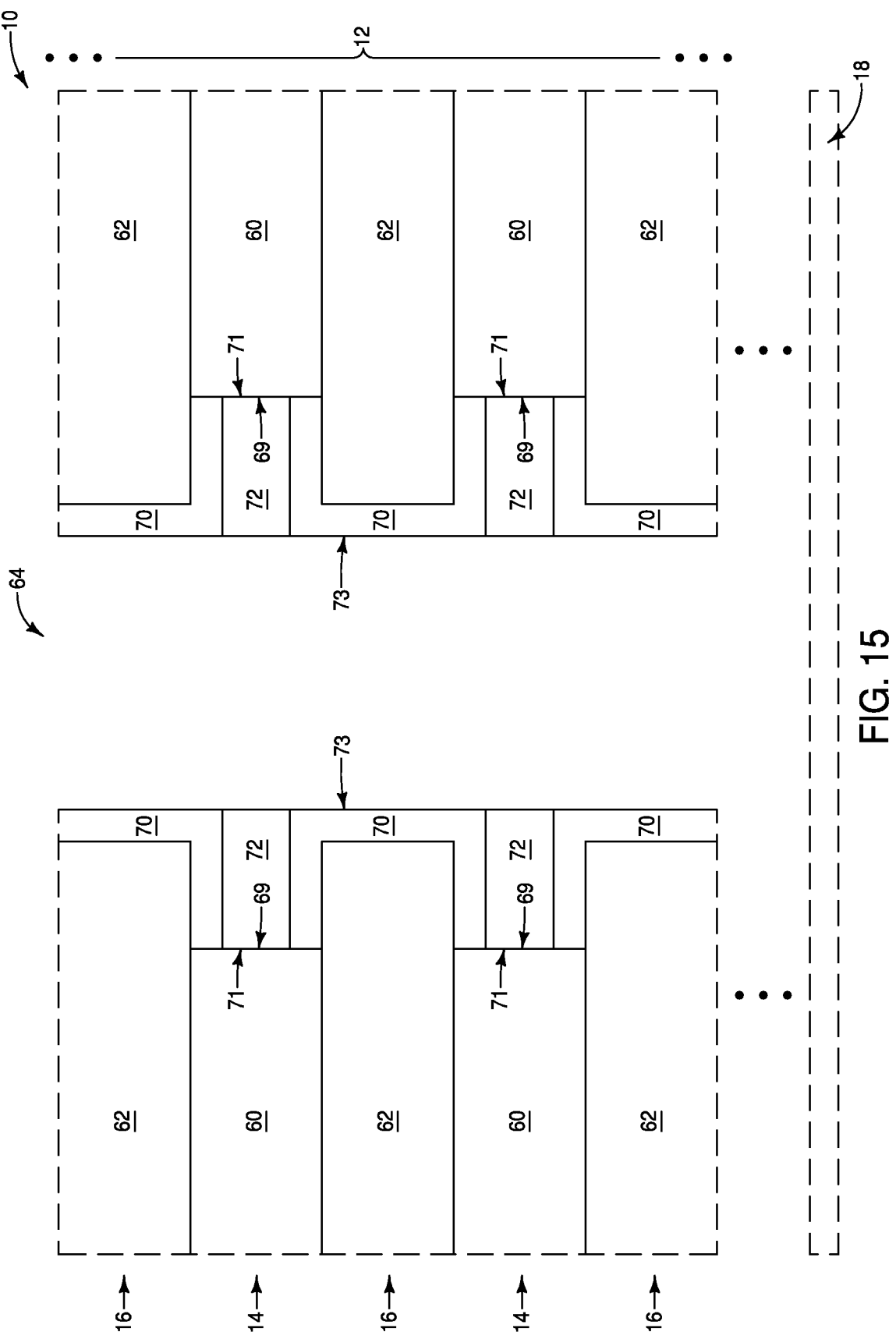

Referring to FIG. 15, a fourth material 72 is formed within the gaps 68 (FIG. 14). The fourth material 72 may comprise any suitable composition(s); and in some embodiments may comprise, consist essentially of, or consist of silicon. For instance, the fourth material 72 may comprise polycrystalline silicon.

The fourth material 72 has inner surfaces 71 which are adjacent (along) the surfaces 69 of the first material 60.

The third and fourth materials 70 and 72 have outer edges that together form a vertical edge 73 along sidewalls of the opening 64.

Figure 16:
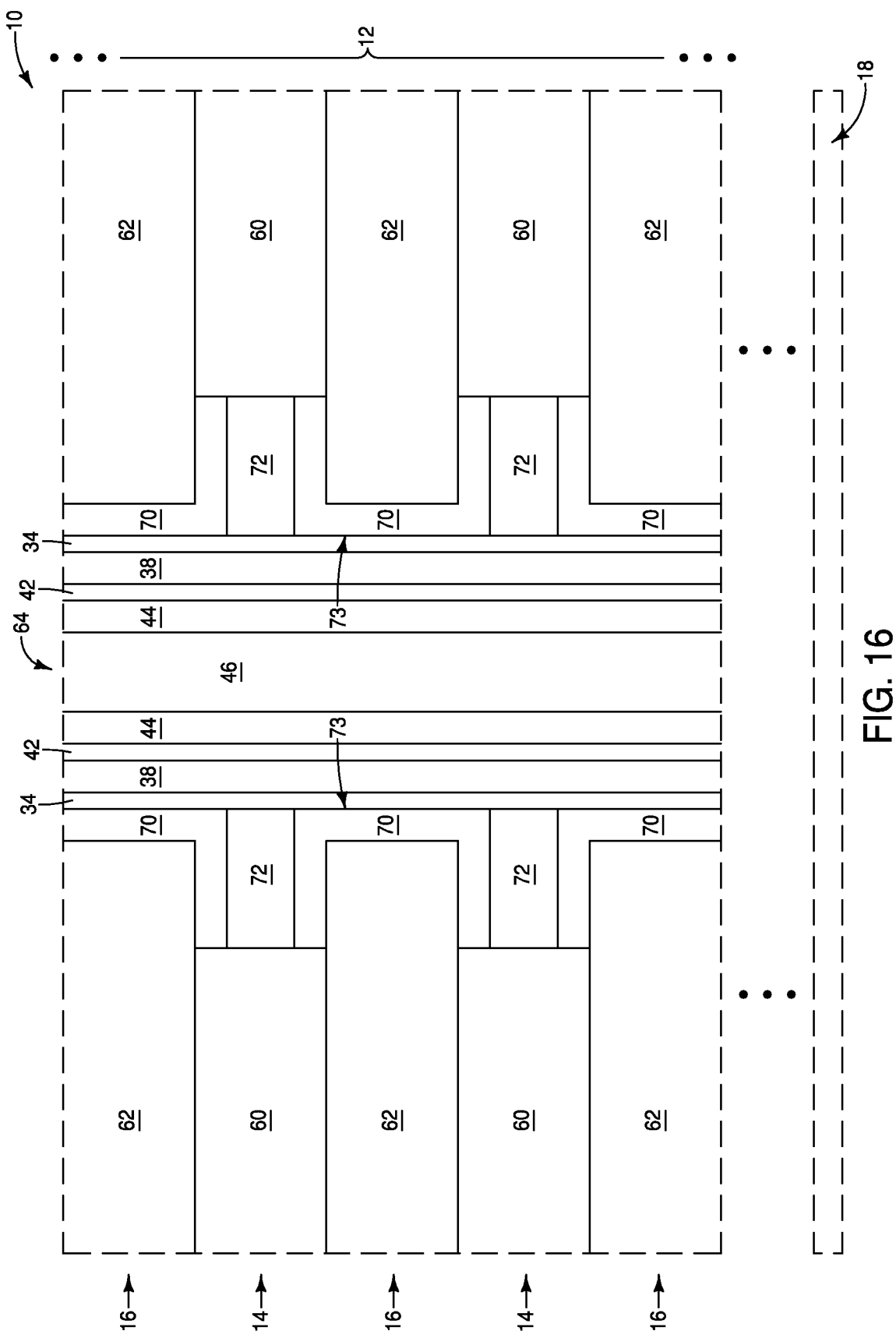

Referring to FIG. 16, the charge-blocking material 34 is formed along the vertical edge 73, the charge-storage material 38 is formed along the charge-blocking material, the gate-dielectric material 42 is formed along the charge-storage material, the channel material 44 is formed along the gate-dielectric material, and the insulative material 46 is formed to fill a remaining inner portion of the opening 64. In some embodiments, the materials 34, 38, 42, 44 and 46 may be considered to be formed to be adjacent to one another. In some embodiments, the charge-storage material 38 may be considered to be formed along the vertical edge 73, and to be spaced from such vertical edge by the charge-blocking material 34. In some embodiments, the materials 34, 38, 42, 44 and 46 may be considered to extend vertically through the stack 12.

Figure 17:
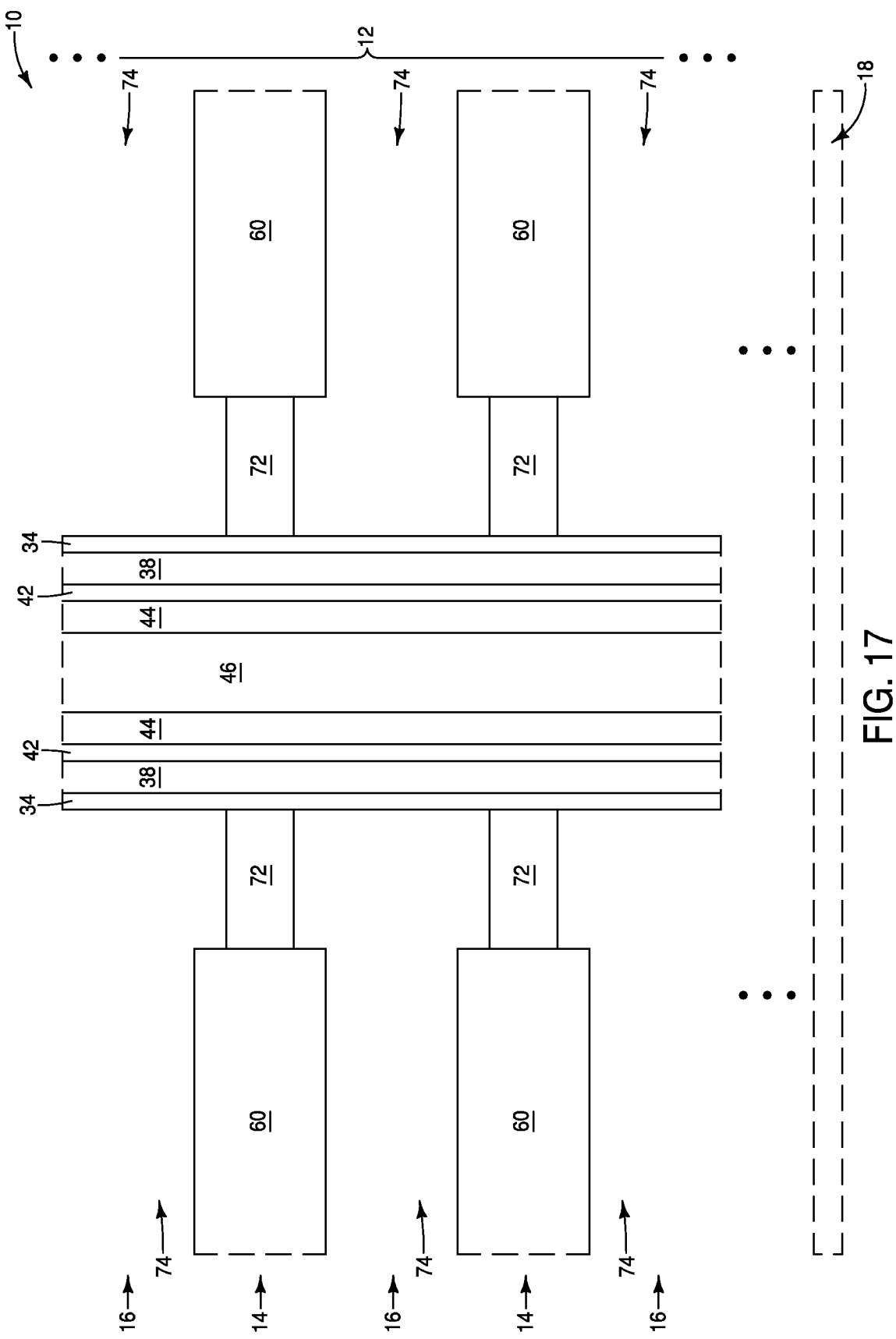

Referring to FIG. 17, the second and third materials 62 and 70 (FIG. 16) are removed to leave voids 74. The voids 74 may be referred to as first voids to distinguish them from other voids which are formed at later process stages.

Figure 18:
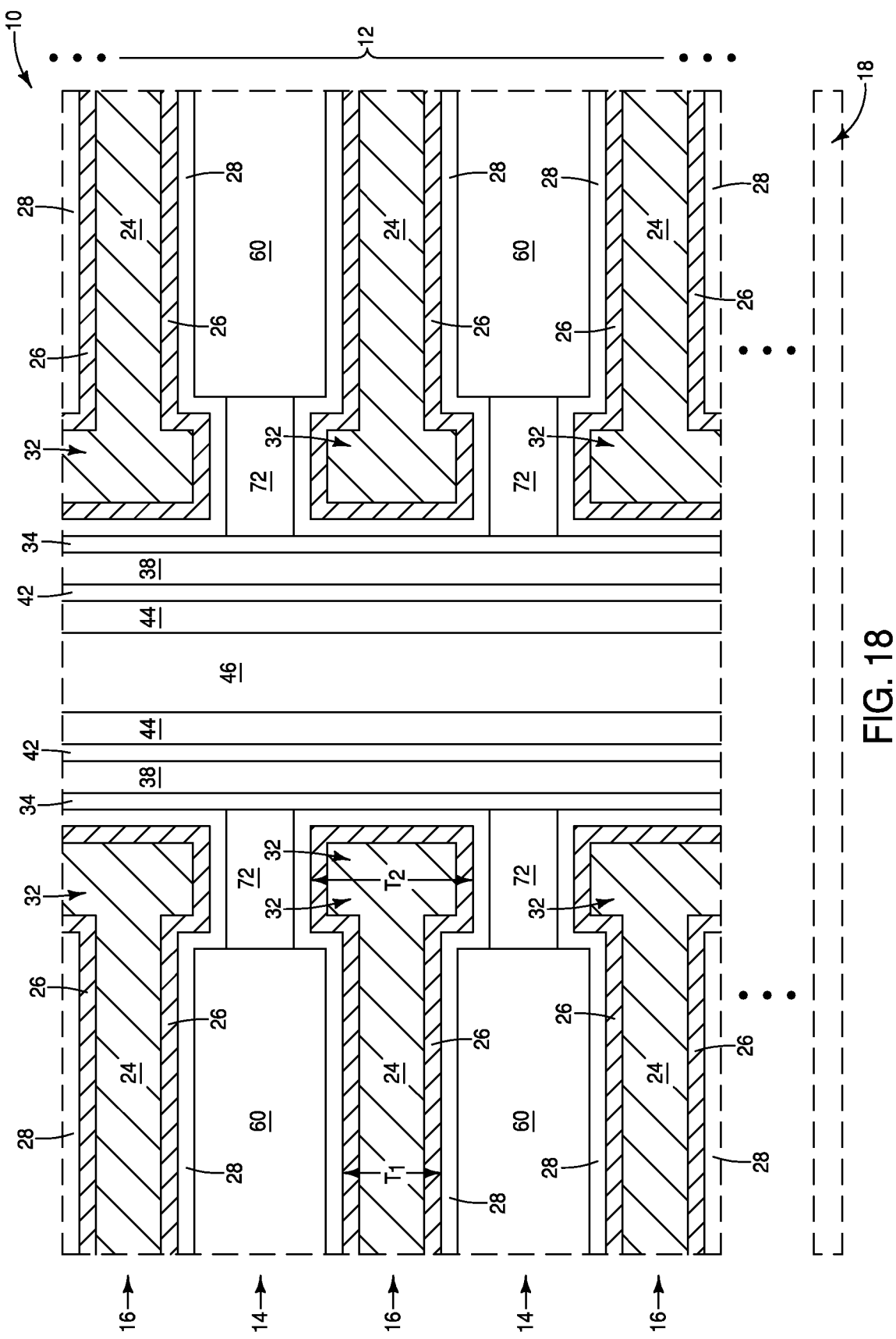
Figure 18A:
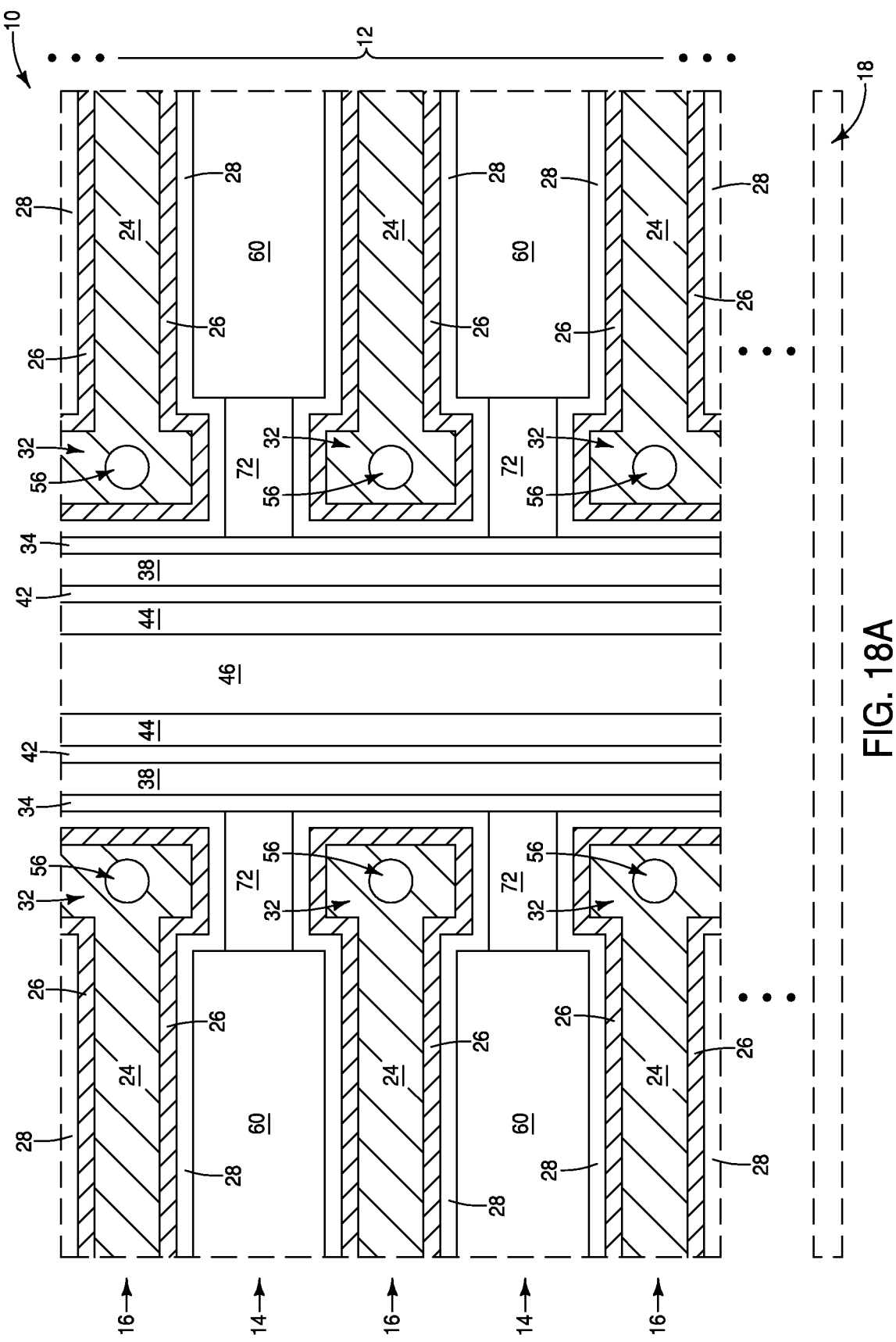
FIG. 18A is a diagrammatic cross-sectional side view of the region of the integrated assembly of FIG. 11 shown at an example process stage following the process stage of FIG. 17 and alternative to the illustrated process stage of FIG. 18.

Referring to FIG. 18, the dielectric barrier material 28, conductive material 26 and conductive material 24 are formed within the voids 74 (FIG. 17). The first levels 16 thus become conductive levels analogous to those described above with reference to FIG. 5. The conductive levels have the primary regions 30 of the first vertical thickness $T_1$ and the terminal projections 32 of the second vertical thickness $T_2$. In the illustrated embodiment, the conductive material 24 entirely fills the terminal projections 32 to form a configuration analogous to that described above with reference to FIG. 5. In other embodiments, the conductive material 24 may only partially fill the terminal projections 32 to leave voids (or keyholes) 56 within the terminal projections 32, as shown in FIG. 18A.

Referring to FIG. 19, the construction 10 is shown at a processing stage subsequent to that of FIG. 18. The first material 60 (FIG. 18) is removed to form voids 76 along the levels 14.

Figure 20:
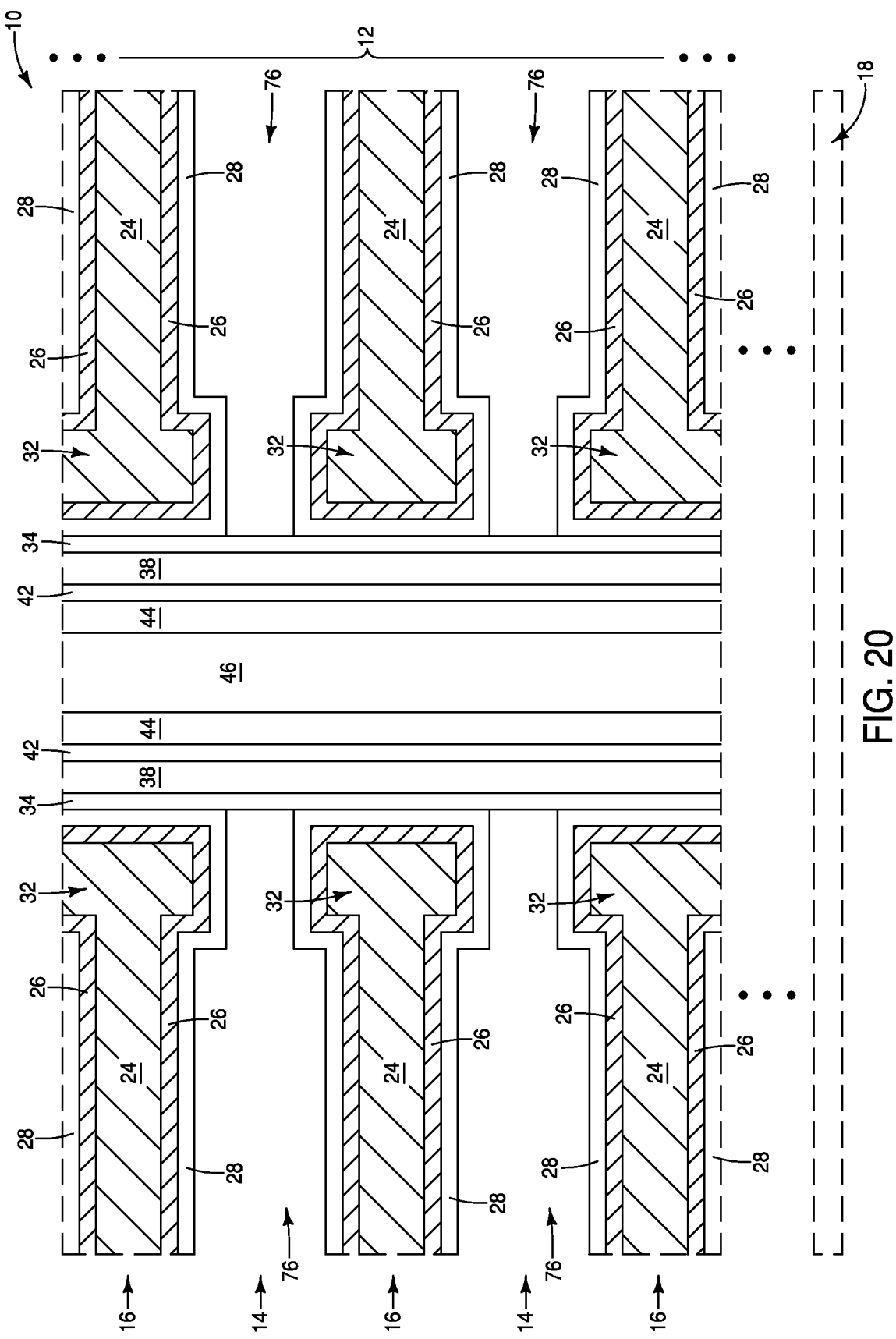

Referring to FIG. 20, the fourth material 72 (FIG. 19) is removed to extend the voids 76. An advantage of utilizing one or more of hafnium oxide, zirconium oxide, hafnium silicate and zirconium silicate as material 28 may be that such can be resistant to the etching conditions utilized to form and extend the voids 76. Aluminum oxide may not be sufficiently resistant to the etch conditions to be suitable for utilization in the material 28 (unless the aluminum oxide is within a laminate having one or more of, for example, hafnium oxide, zirconium oxide, hafnium silicate and zirconium silicate outward of the aluminum oxide to protect the aluminum oxide).

The voids 76 of FIG. 20 may be referred to as second voids to distinguish them from the first voids 74 of FIG. 17.

Figure 21:
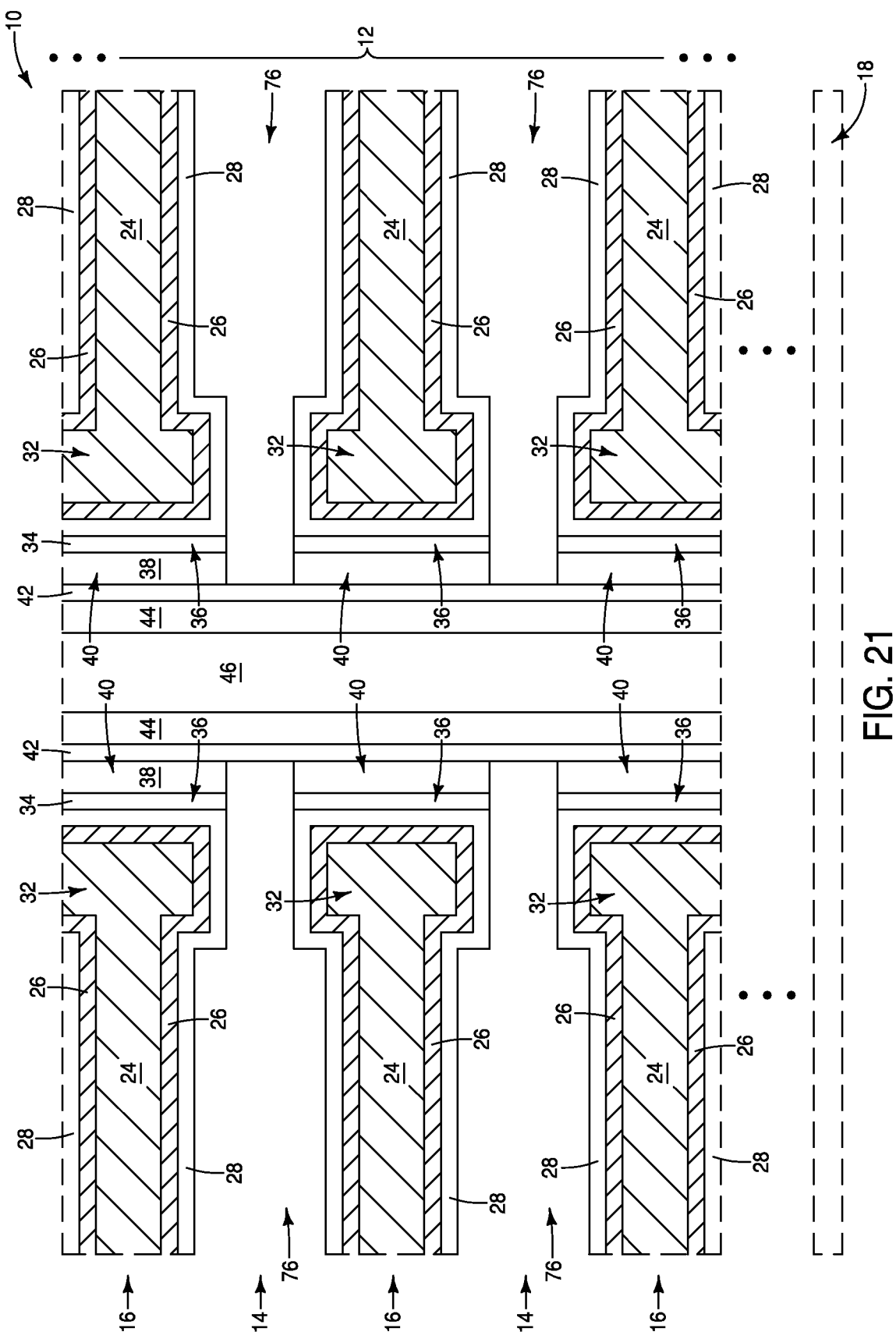

Referring to FIG. 21, the second voids 76 are extended through the charge-blocking material 34 and the charge-storage material 38 to divide such materials into the segments 36 and 40, respectively. In some embodiments (not shown), the voids 76 may also be extended through the gate-dielectric material 42.

Figure 22:
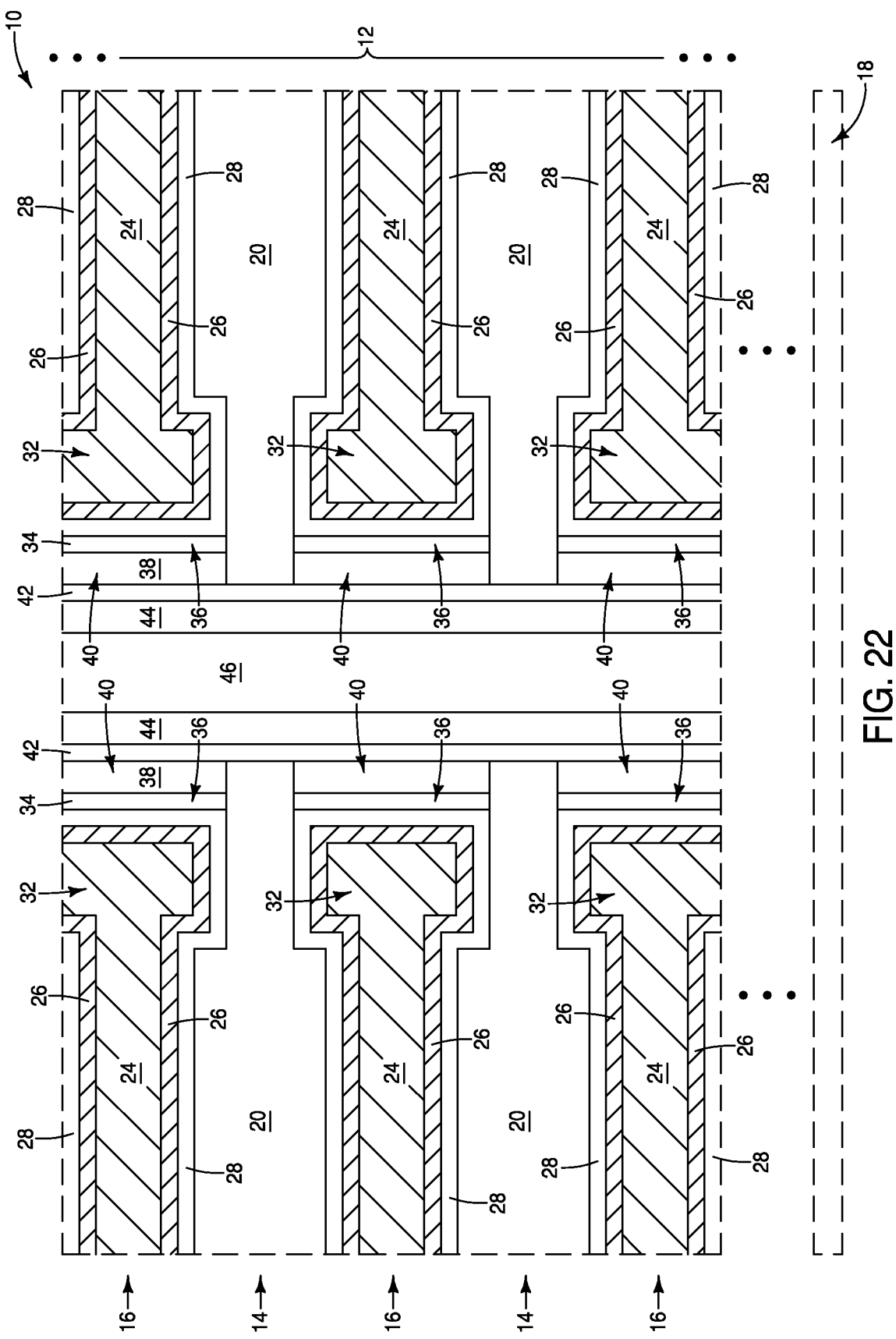

Referring to FIG. 22, the voids 76 (FIG. 21) are filled with the insulative material 20 to form a configuration analogous to that described above with reference to FIG. 5. In other embodiments, the voids 20 may remain at least partially open (i.e., gas-filled) to form configurations analogous to those described above with reference to FIGS. 6 and 8.

Another example method for forming example integrated assemblies is described with reference to FIGS. 23-30.

Figure 23:
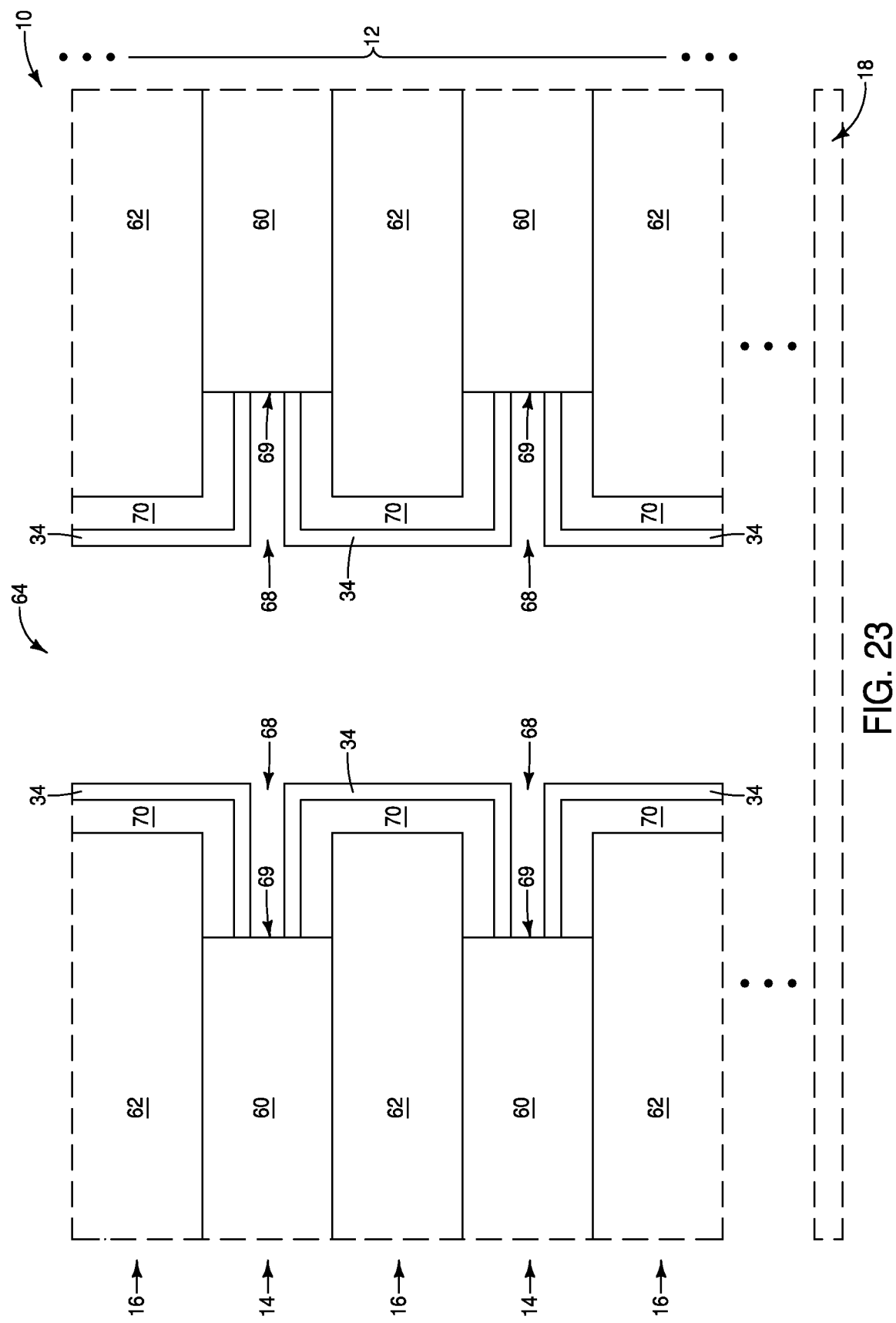
FIG. 23 is a diagrammatic cross-sectional side view of an integrated assembly at an example process stage of an example method for forming an example memory array.

Referring to FIG. 23, the construction 10 is shown at a process stage which may follow the process stage of FIG. 14. The charge-blocking material 34 is formed along the third material 70. In some embodiments, the third material 70 comprises silicon nitride, and the charge-blocking material 34 comprises silicon oxynitride (and/or silicon dioxide) formed by oxidizing the third material 70. In some embodiments, the material 34 may be referred to as a fifth material. The third material 70 may be considered to form widened terminal ends around the projections of material 62, and the fifth material 34 may be considered to be formed around such widened terminal ends.

The material 34 narrows the gaps 68.

The material 34 may be formed to any suitable thickness; and in some embodiments may be formed to a thickness within a range of from about 1 nm to about 5 nm.

Figure 23A:
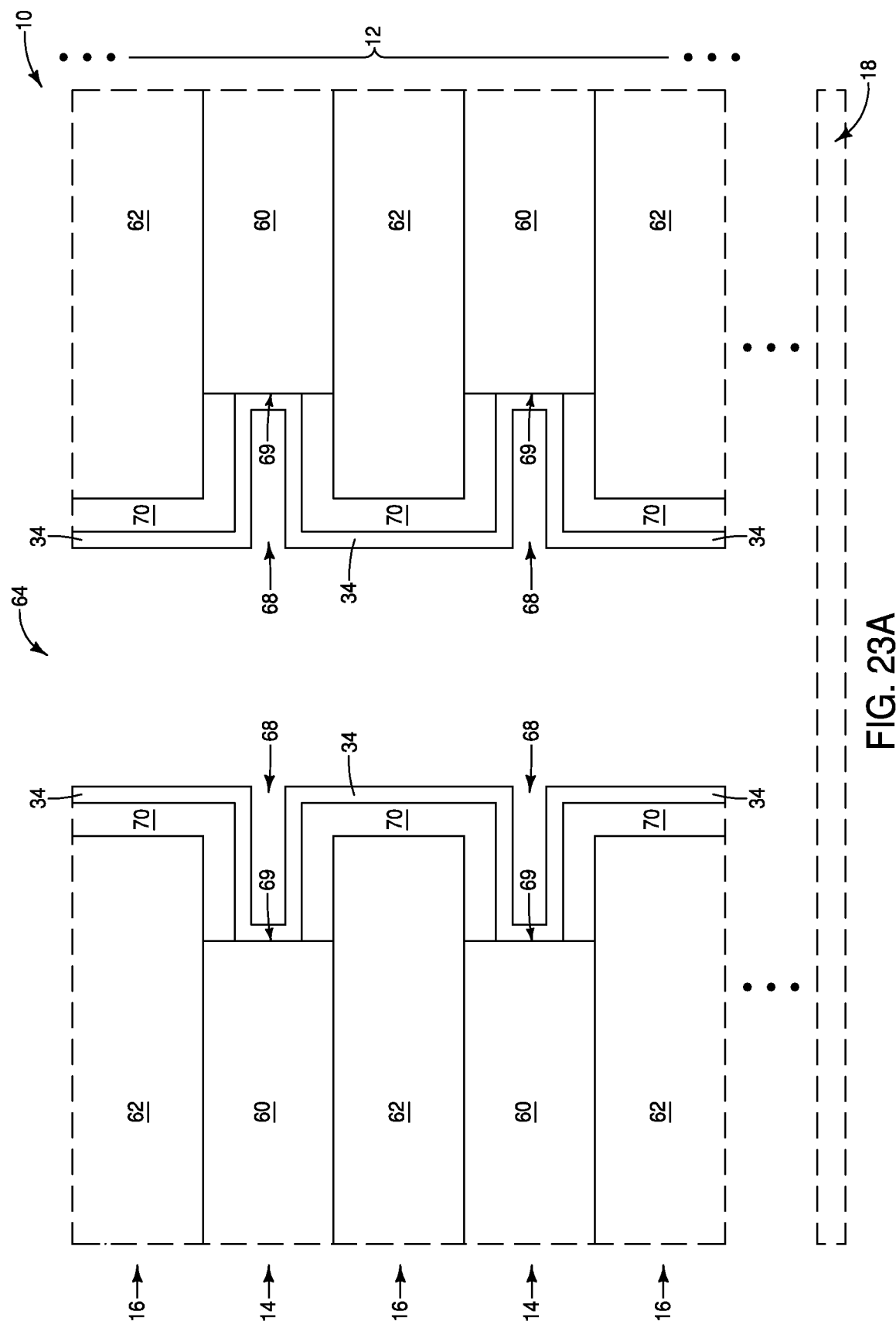
FIG. 23A is a diagrammatic cross-sectional side view of an integrated assembly at an example process stage of an example method for forming an example memory array, and may be alternative to the illustrated process stage of FIG. 23.

In some embodiments, the material 34 (the fifth material) may be formed by a deposition process, and may be formed to extend across the surfaces 69 within the gaps 68 as well as along the material 70; as shown in FIG. 23A.

Referring to FIG. 24, the assembly 10 is shown at a process stage following FIG. 23. The fourth material 72 is formed within the narrowed gaps 68 (FIG. 23). The vertical edge 73 extends along the materials 34 and 72.

Figure 25:
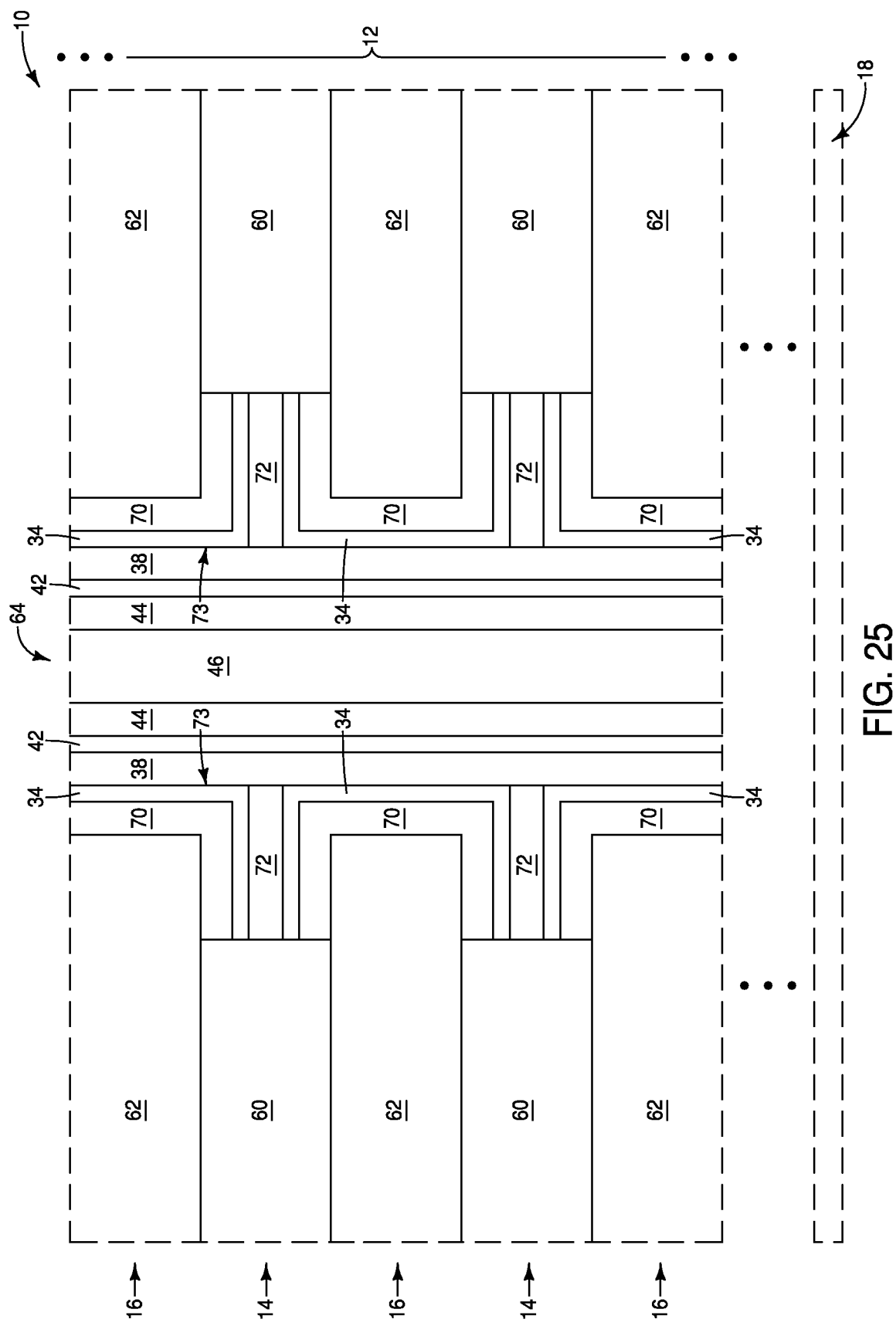

Referring to FIG. 25, the charge-storage material 38 is formed along the vertical edge 73, the gate-dielectric material 42 is formed along the charge-storage material, the channel material 44 is formed along the gate-dielectric material, and the insulative material 46 is formed to fill a remaining inner portion of the opening 64.

Figure 25A:
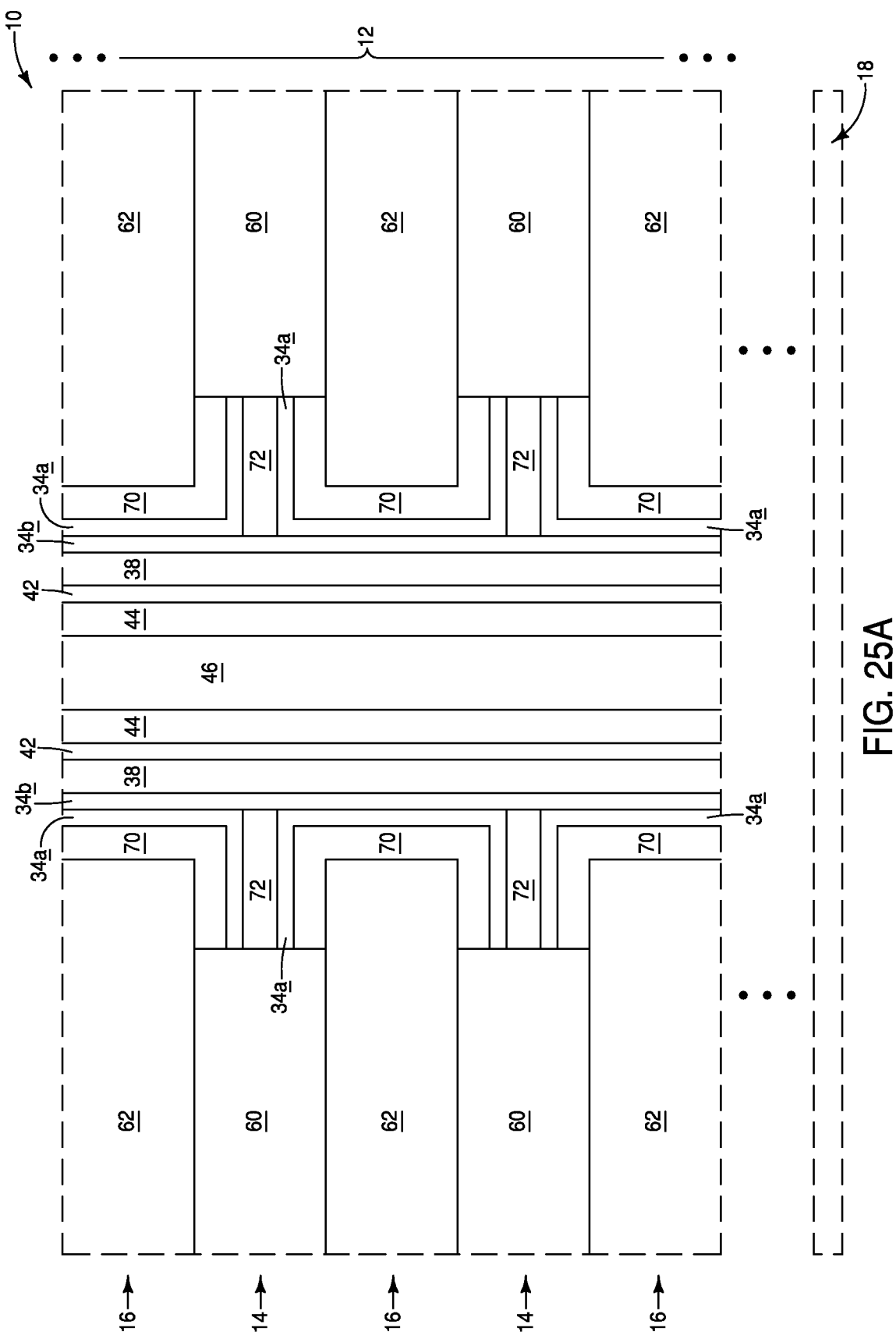
FIG. 25A is a diagrammatic cross-sectional side view of the region of the integrated assembly of FIG. 23 shown at an example process stage following the process stage of FIG. 24 and alternative to the illustrated process stage of FIG. 25.

In some embodiments, the material 34 of FIG. 24 may be a first charge-blocking material 34a, and a second charge-blocking material 34b may be deposited at a subsequent process stage. For instance, FIG. 25A shows assembly 10 at a process stage alternative to that described above with reference to FIG. 25. A second charge-blocking material 34b is formed along the vertical edge 73, and then the charge-storage material 38, gate-dielectric material 42, channel material 44 and insulative material 46 are formed. The assembly of FIG. 25A may be utilized to form a construction analogous to that described above with reference to FIG. 10.

Figure 26:
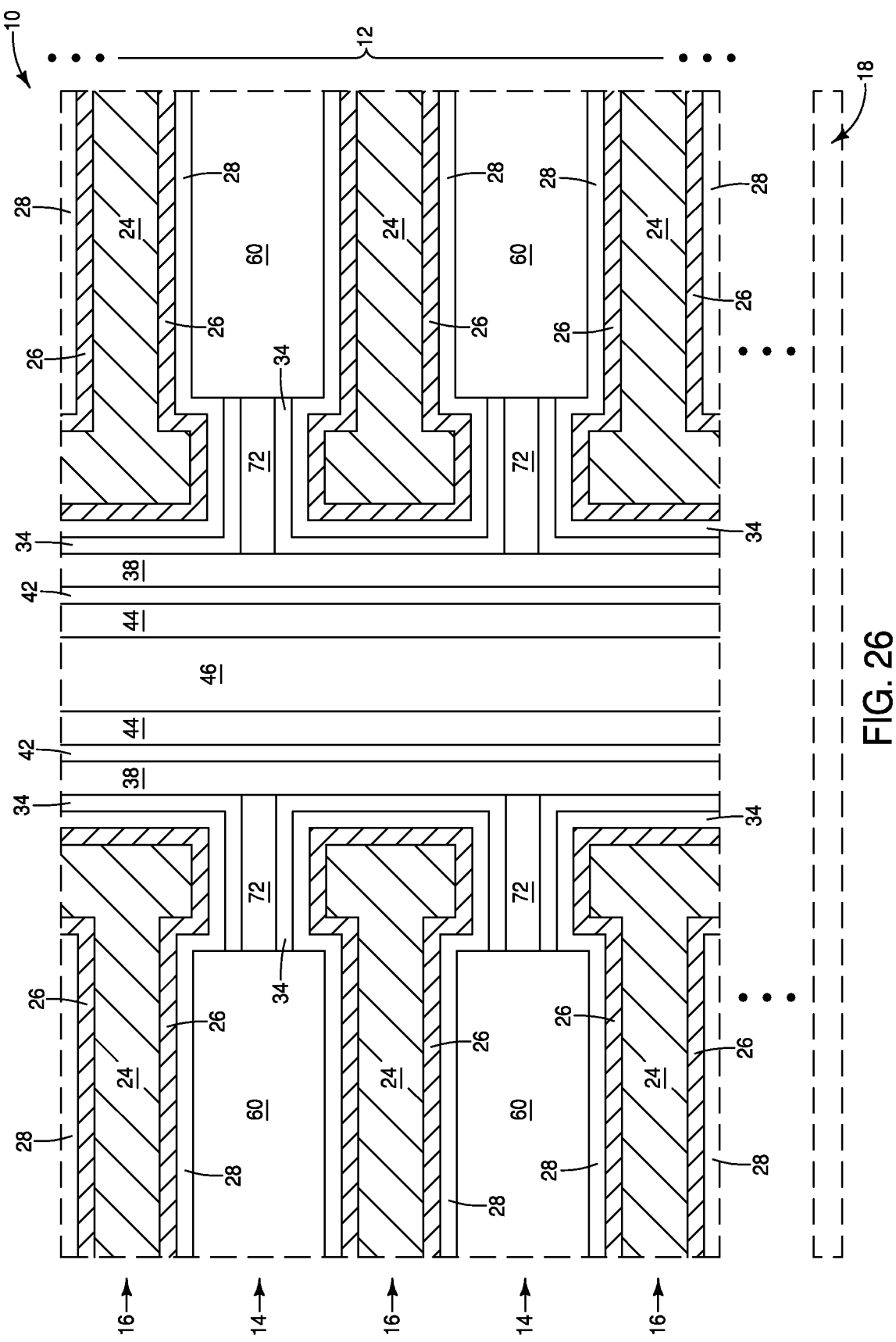
FIGS. 26-30 are diagrammatic cross-sectional side views of the region of the integrated assembly of FIG. 23 shown at example sequential process stages following the process stage of FIG. 25.

Referring to FIG. 26, the assembly 10 is shown at a process stage subsequent to that of FIG. 25. The second and third materials 62 and 70 (FIG. 25) are removed, and are replaced with the materials 24, 26 and 28. Such removal and replacement may utilize processing analogous to that described above with reference to FIGS. 17 and 18.

Figure 27:
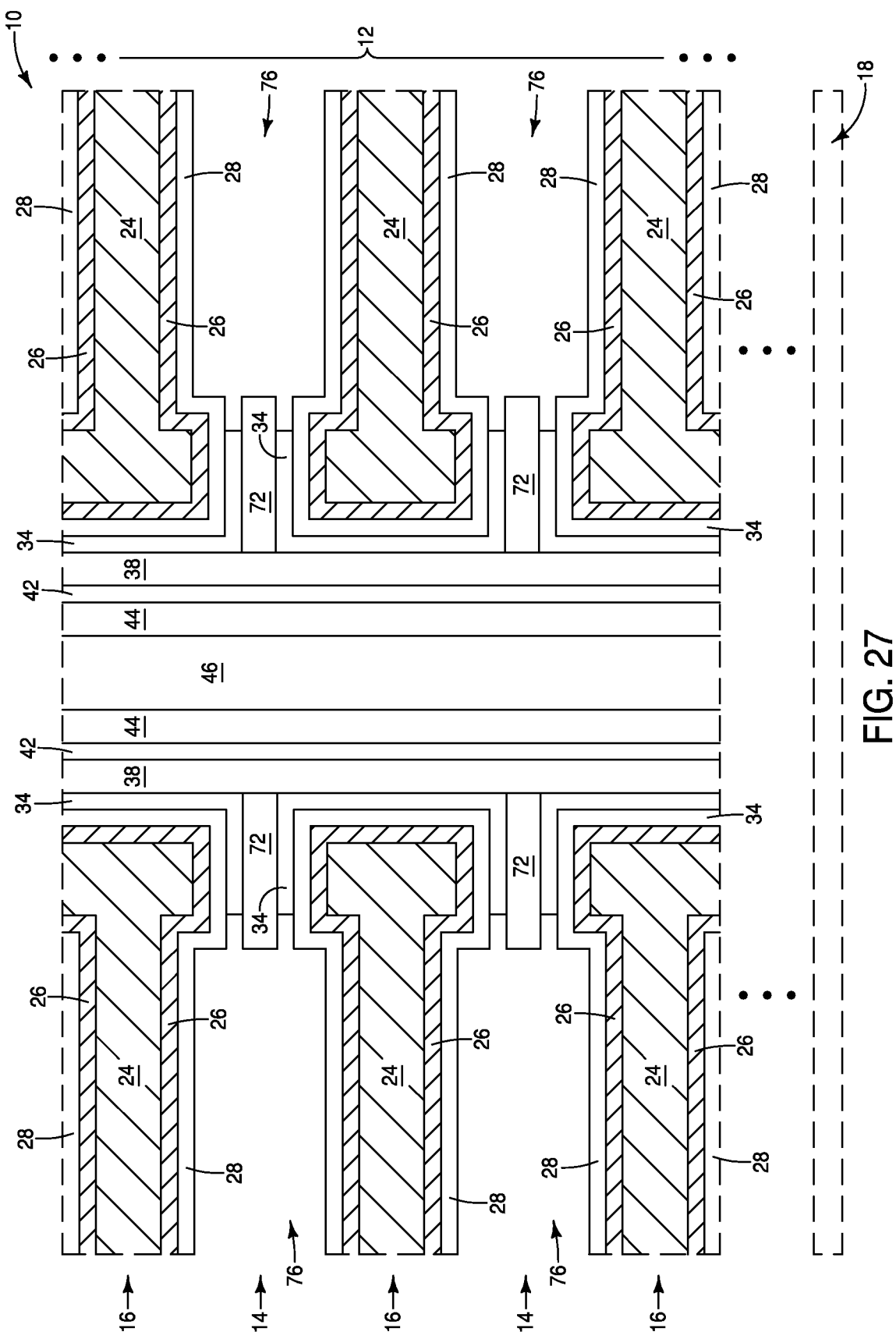

Referring to FIG. 27, the first material 60 (FIG. 26) is removed to form the second voids 76 along the levels 14. In the illustrated embodiment, some of the material 34 is removed during the etch utilized to remove material 60. The material 34 may or may not be removed during the etch utilized to remove material 60 depending on the relative compositions of materials 34 and 60 and on the etching conditions utilized.

Figure 28:
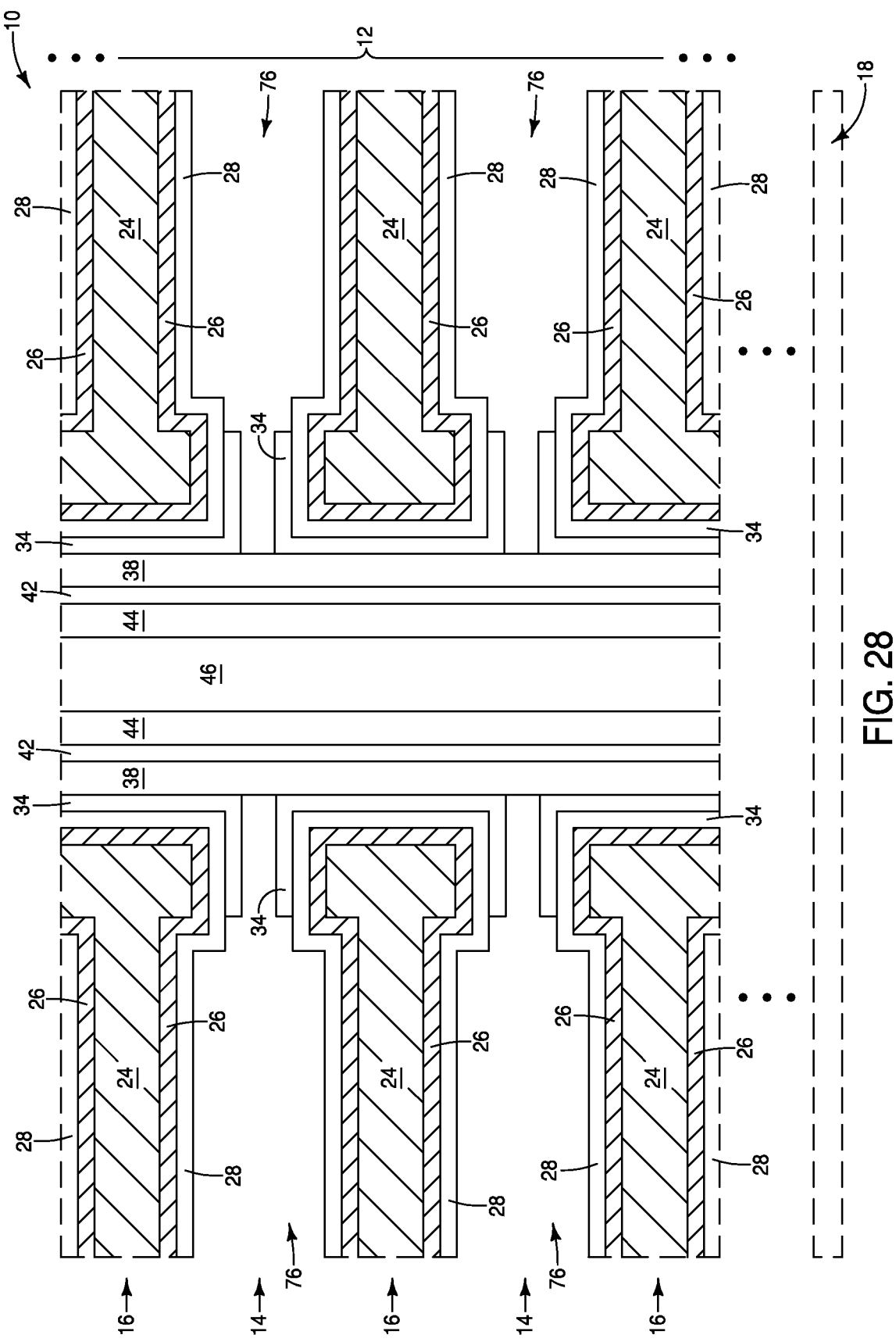

Referring to FIG. 28, the fourth material 72 (FIG. 27) is removed to extend the voids 76.

Figure 29:
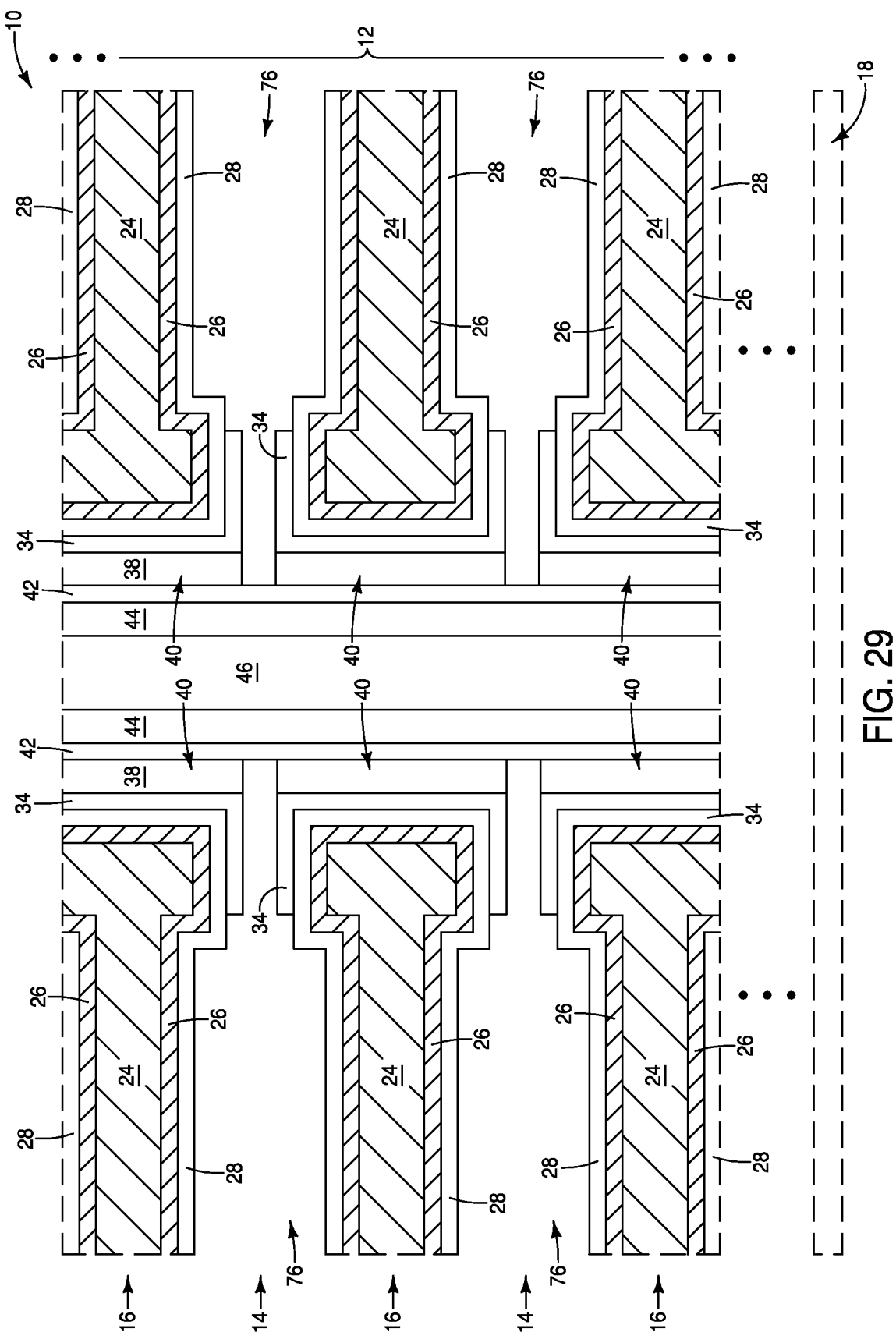

Referring to FIG. 29, the voids 76 are extended through the charge-storage material 38 to divide such material into the segments 40.

Figure 30:
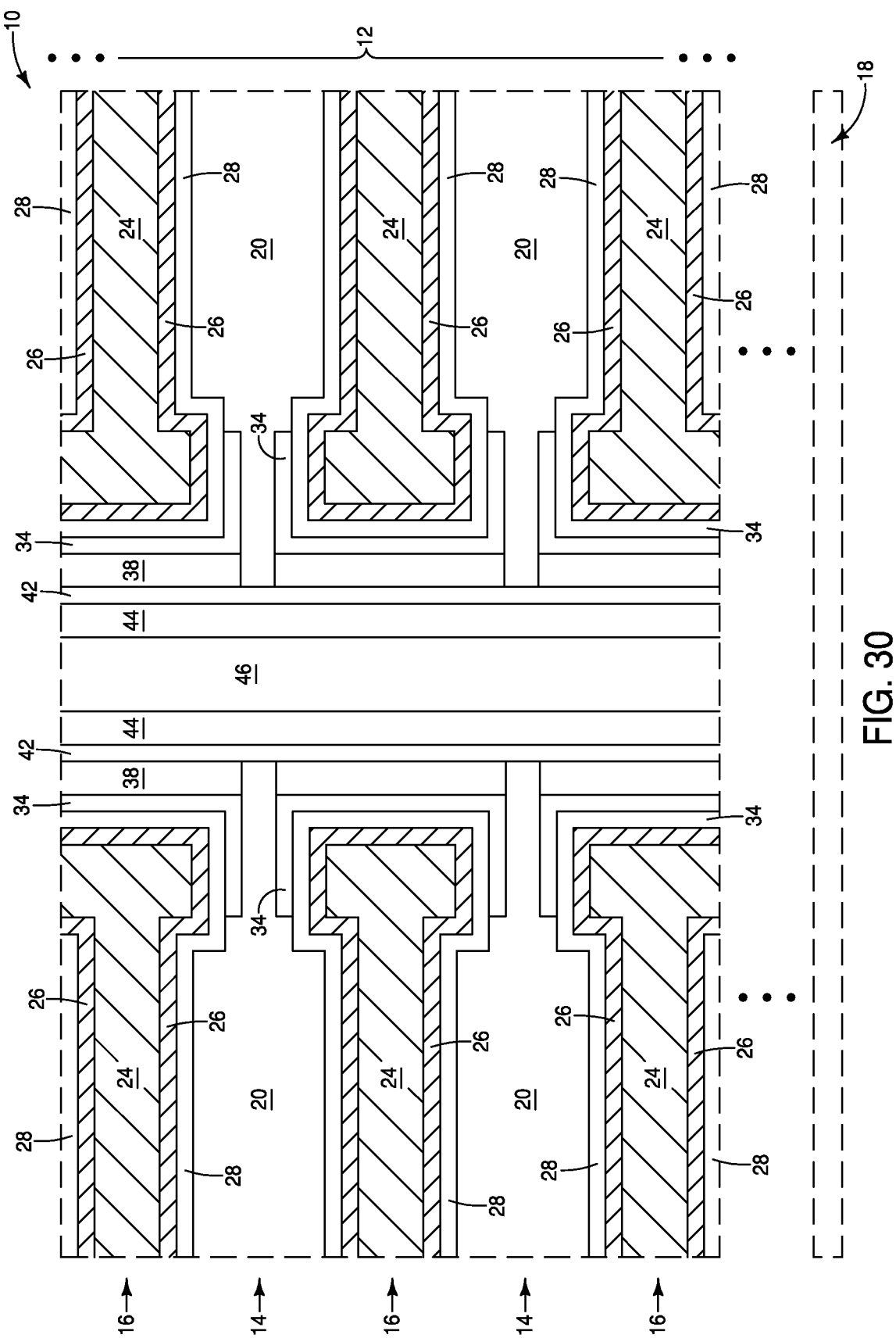

Referring to FIG. 30, the voids 76 (FIG. 29) are filled with the insulative material 20 to form a configuration analogous to that described above with reference to FIG. 9. In other embodiments, the voids 20 may remain at least partially open (i.e., gas-filled) to form configurations analogous to those described above with reference to FIGS. 6 and 8.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated structure which includes a vertical stack of alternating insulative levels and conductive levels. The conductive levels have primary regions of a first vertical thickness, and have terminal projections of a second vertical thickness which is greater than the first vertical thickness. Charge-blocking material is arranged in vertically-stacked first segments. The first segments are along the conductive levels, and are adjacent the terminal projections. The first segments are vertically spaced from one another by first gaps. Charge-storage material is arranged in vertically-stacked second segments. The second segments are along the conductive levels, and are adjacent the first segments. The second segments are vertically spaced from one another by second gaps. Gate-dielectric material is adjacent the charge-storage material. Channel material is adjacent the gate-dielectric material. The channel material extends vertically along the vertical stack.

Some embodiments include a NAND memory array having a vertical stack of alternating insulative levels and wordline levels. The wordline levels have primary regions of a first vertical thickness, and have terminal projections of a second vertical thickness which is greater than the first vertical thickness. The terminal projections include control gate regions. Charge-blocking regions are adjacent the control gate regions, and are vertically spaced from one another. Charge-storage regions are adjacent the charge-blocking regions and are vertically spaced from one another. Gate-dielectric material is adjacent the charge-storage regions. Channel material extends vertically along the vertical stack and is adjacent the gate dielectric material.

Some embodiments include a method of forming an integrated structure. A vertical stack is formed to include alternating first and second levels. The first levels comprise first material, and the second levels comprise second material. The first levels are recessed relative to the second levels. The second levels have projecting terminal ends extending beyond the recessed first levels. The terminal ends have surfaces of the second material. The recessed first levels have surfaces of the first material. Third material is formed selectively along the second material relative to the first material. The third material extends around the terminal ends of the second levels to widen the terminal ends. The widened terminal ends are vertically spaced from one another by gaps. Fourth material is formed within the gaps. The third and fourth materials have outer surfaces that form a vertical edge. Inner surfaces of the fourth material are adjacent the surfaces of the first material. Charge-storage material is formed to extend vertically along the vertical edge. Gate-dielectric material is formed to extend vertically along the charge-storage material. Channel material is formed to extend vertically along the gate-dielectric material. The second and third materials are removed to leave first voids. Conductive levels are formed within the first voids. The conductive levels have primary regions of a first vertical thickness, and have terminal projections of a second vertical thickness which is greater than the first vertical thickness. The first and fourth materials are removed to leave second voids. The second voids are extended through the charge-storage material to divide the charge-storage material into vertically-spaced segments.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated structure, comprising:
   forming a vertical stack of alternating first and second levels; the first levels comprising first material, and the second levels comprising second material;
   recessing the first levels relative to the second levels; the second levels having projecting terminal ends extending beyond the recessed first levels; the terminal ends having surfaces of the second material; the recessed first levels having surfaces of the first material;
   forming third material along the second material selectively relative to the first material; the third material extending around the terminal ends of the second levels to widen the terminal ends; the widened terminal ends being vertically spaced from one another by gaps;
   forming fourth material within the gaps; the third and fourth materials having outer surfaces that form a vertical edge; inner surfaces of the fourth material being adjacent the surfaces of the first material;
   forming charge-storage material extending vertically along the vertical edge;
   forming gate-dielectric material extending vertically along the charge-storage material;
   forming channel material extending vertically along the gate-dielectric material;
   removing the second and third materials to leave first voids;
   forming conductive levels within the first voids; the conductive levels having primary regions of a first vertical thickness, and having terminal projections of a second vertical thickness which is greater than the first vertical thickness;
   removing the first and fourth materials to leave second voids; and
   extending the second voids through the charge-storage material to divide the charge-storage material into vertically-spaced segments.

2. The method of claim 1 further comprising at least partially filling the second voids with insulative material.

3. The method of claim 1 wherein the conductive levels only partially fill the first voids, and wherein regions of the first voids remain within the terminal projections of the conductive levels.

4. The method of claim 1 further comprising forming charge-blocking material extending along the third material; and wherein the forming of the charge-storage material comprises forming the charge-storage material to extend vertically along the charge-blocking material.

5. The method of claim 1 further comprising forming charge-blocking material extending along the third material; and wherein:
   the forming of the charge-storage material comprises forming the charge-storage material to extend vertically along the charge-blocking material;
   the vertically-spaced segments of the charge-storage material are vertically-spaced second segments; and
   the extending of the second voids comprises extending the second voids through the charge-blocking material to divide the charge-blocking material into vertically-spaced first segments.

6. The method of claim 1 further comprising forming a fifth material around the widened terminal ends prior to forming the fourth material.

7. The method of claim 6 wherein the fifth material comprises one or both of silicon oxynitride and silicon dioxide.

8. The method of claim 6 wherein the fifth material is formed to extend across the gaps and along the first surfaces.

9. The method of claim 6 wherein the charge-storage material is formed directly against the fifth material.

10. The method of claim 6 wherein the fifth material is charge-blocking material, and wherein additional charge-blocking material is formed along the fifth material prior to forming the charge-storage material.

11. The method of claim 1 wherein the second and third materials are a same composition as one another.

12. The method of claim 11 wherein the second and third materials comprise silicon nitride, and wherein the first material comprises silicon dioxide.

13. The method of claim 12 wherein the fourth material consists essentially of silicon.

* * * * *